United States Patent
Takahashi et al.

(10) Patent No.: US 7,312,013 B2
(45) Date of Patent: Dec. 25, 2007

(54) PHOTOREACTIVE COMPOSITION

(75) Inventors: Katsunori Takahashi, Mishima-gun (JP); Hiroji Fukui, Mishima-gun (JP); Kazuhiro Kawabata, Mishima-gun (JP); Takeo Kuroda, Mishima-gun (JP); Motokuni Ichitani, Mishima-gun (JP); Yasuhiro Nakatani, Mishima-gun (JP)

(73) Assignee: Sekisui Chemical Co., Ltd., Osaka (JP)

( * ) Notice: Subject to any disclaimer, the term of this patent is extended or adjusted under 35 U.S.C. 154(b) by 123 days.

(21) Appl. No.: 10/474,376

(22) PCT Filed: Apr. 9, 2002

(86) PCT No.: PCT/JP02/03520

§ 371 (c)(1),
(2), (4) Date: Mar. 10, 2004

(87) PCT Pub. No.: WO02/083764

PCT Pub. Date: Oct. 24, 2002

(65) Prior Publication Data

US 2004/0202956 A1    Oct. 14, 2004

(30) Foreign Application Priority Data

| Apr. 9, 2001 | (JP) | ............................... 2001-110138 |
| Nov. 13, 2001 | (JP) | ............................... 2001-347708 |
| Nov. 22, 2001 | (JP) | ............................... 2001-357853 |
| Mar. 7, 2002 | (JP) | ............................... 2002-062421 |

(51) Int. Cl.
*G03C 1/73* (2006.01)
*G03C 1/725* (2006.01)
*G03F 7/004* (2006.01)

(52) U.S. Cl. .................. 430/270.1; 430/46.3; 430/430; 430/913; 430/916; 430/923; 522/33; 522/36; 522/38; 522/39; 522/172

(58) Field of Classification Search ............ 430/270.1, 430/280.1, 281.1, 285.1, 286.1, 287.1, 9, 430/18, 311, 320, 321, 914, 916; 385/12, 385/37

See application file for complete search history.

(56) References Cited

U.S. PATENT DOCUMENTS 3,615,943 A * 10/1971 Genser ....................... 438/559
5,020,879 A * 6/1991 Kuzuta et al. ............... 359/573
5,799,117 A * 8/1998 Kragl et al. ................... 385/14
6,025,445 A * 2/2000 Chiba et al. .............. 525/326.5
6,207,728 B1 * 3/2001 Sekiguchi et al. ............ 522/83
2003/0032729 A1 * 2/2003 Takai et al. .................. 525/107

FOREIGN PATENT DOCUMENTS

| JP | 53097098 | 8/1978 |
| JP | 2043215 | 2/1990 |
| JP | 6166501 | 6/1994 |
| JP | 6273936 | 9/1994 |
| JP | 7187669 | 7/1995 |
| JP | 2000001648 | 1/2000 |
| JP | 2000066051 | 3/2000 |
| JP | 2000144012 | 5/2000 |
| JP | 2000167993 | 6/2000 |
| JP | 2000169755 | 6/2000 |
| JP | 2000171604 | 6/2000 |
| JP | 2000-298352 | * 10/2000 |
| JP | 2000298352 | 10/2000 |
| JP | 2000327980 | 11/2000 |
| JP | 2001083342 | 3/2001 |
| JP | 2001083710 | 3/2001 |
| JP | 2001515533 | 9/2001 |
| JP | 2001288364 | 10/2001 |
| JP | 2001300951 | 10/2001 |
| JP | 2002069387 | 3/2002 |
| WO | WO 98/40439 | 9/1998 |

OTHER PUBLICATIONS

DERWENT English abstract for JP 2000-298352 (Sato et al).*
Machine-assisted English translation for JP 2000-298352 (Sato et al), provided by JPO.*

* cited by examiner

*Primary Examiner*—Sin Lee
(74) *Attorney, Agent, or Firm*—Connolly Bove Lodge and Hutz

(57) ABSTRACT

This invention provides a photoreactive composition in which reaction of a hydrolyzable metal compound takes place by irradiation of light.

A photoreactive composition, which comprises a hydrolyzable metal compound (A) comprising a metal atom and a hydrolyzable functional group bonded to the metal atom and, a compound (B) promoting reaction, polymerization or crosslinking of the compound (A) in the presence of oxygen by irradiation of light.

6 Claims, No Drawings

PHOTOREACTIVE COMPOSITION

TECHNICAL FIELD

The present invention relates to a photoreactive composition in which reaction of a hydrolyzable metal compound takes place by irradiation of light.

BACKGROUND ART

As a method for producing a metal oxide thin film, a physical method such as a sputtering method, a vacuum evaporation method and the like, and a chemical method such as a CVD method and the like have been conventionally known. However, these methods all have a problem that they require costly apparatus such as a vacuum apparatus or the like.

On the contrary, so-called sol-gel method using a metal alkoxide as a raw material for causing polymerization or crosslinking by hydrolysis and condensation reaction of the raw material has been proposed. However, although such a method is capable of producing an oxide thin film using a relatively economical apparatus, there is a problem that a firing of sol has to be carried out at a high temperature.

As a technique for solving the above-mentioned problems, a method for producing a metal oxide thin film using photoreaction has been examined.

For example, Japanese Kokai Publication Hei-7-187669 discloses a composition containing a substance generating water or an acid by irradiation of light. However, this method is disadvantageous in points that it requires examinations of solubilities of respective components for hydrolysis by water or an acid and that it also requires a high energy beam source such as a low pressure mercury lamp and an excimer laser for decomposing the substance which generates water or an acid.

Japanese Kokai Publication Hei-6-166501 discloses a method for providing photoreactivity by using a β-diketone compound such as acetylacetone, benzoylacetone and the like as an additive. In this method, a curing reaction is supposed to take place attributed to $\pi \rightarrow \pi^*$ transition of conjugated electron system characteristic of a metal compound caused by UV rays. However, with respect to a metal compound having no such conjugated system, sufficient reactivity by UV rays cannot be expected. For example, there is a problem that a zinc compound useful as a material for a conductor film and a varistor and a silicon compound useful for an interlayer insulating film cannot be cured.

Among metal oxides, especially compounds having hydrolyzable silyl group such as alkoxyl group containing Si as a metal element are suitable to obtain cured bodies with hardness varying in an extremely wide range covering from hard and fragile properties to soft and elastic properties after being polymerized or crosslinked. Moreover, extremely viscous materials just like grease and sticky materials can also be obtained as the cured bodies. Owing to such properties, compounds having hydrolyzable silyl group can be used widely for industrial uses such as a coating material, grease, a pressure sensitive adhesive, an adhesive, a sealing material, an elastomer, a mold-releasing agent and the like.

However, in the case where a composition containing such a conventionally known compound having hydrolyzable silyl group as described above is used especially as a one-component type adhesive or sealing agent excellent in convenience, since it is made possible to be polymerized or crosslinked by moisture in air, the composition requires to be kept from moisture for storage and it is required to keep the humidity of air constantly low or store the composition in an air-tight container and the like.

Accordingly, such an adhesive or the like is mainly used for a work in a working field where an adhesive sealed in an air-tight container is to be completely consumed within a short time once the container is opened and in the case where storage stability is required due to use in open system for a long duration, for example, in the case of use in a common coating apparatus employed in a production line or the like, stable use of such an adhesive is difficult. That is, in a common coating apparatus, no countermeasure for shutting moisture during the storage and supply of the adhesive is made and there are some types of coating apparatuses which are impossible to shut moisture in terms of the structure.

In order to use an adhesive in a production line, in consideration of line productivity, such a one-component type adhesive in which a compound having a hydrolyzable silyl group and a compound promoting hydrolysis and condensation reaction coexist and therefore which quickly exhibits the adhesive force without requiring mixing is preferable, however such a composition has a problem of inferior storage stability.

When a compound promoting hydrolysis and condensation reaction is selected so as to give a composition excellent in storage stability, there occurs another problem that polymerization or crosslinking reaction cannot be caused quickly in the use.

That is, it has been difficult to obtain a composition which contains a compound having hydrolyzable silyl group and a compound promoting hydrolysis and condensation reaction in form of a one-component liquid and at the same time which is excellent in storage stability and whose polymerization or crosslinking reaction is quickly promoted.

As a technique to solve the above-mentioned problems, a composition which contains a silane compound having an alkoxysilyl or alkylalkoxysilyl group and an aromatic onium salt catalyst and is excellent in storage stability and whose polymerization or crosslinking reaction is quickly promoted is disclosed in Japanese Kokai Publication Sho-53-97098. As reported in "Radiation Curing in Polymer Science and Technology", (vol 2, Elsevier Applied Science, London, 1993), the technique involves irradiating radiation beam to the aromatic onium salt catalyst for activating the aromatic onium salt catalyst to generate protonic acid from the aromatic onium salt catalyst and promoting hydrolysis and condensation reaction of the alkoxysilyl or alkylalkoxysilyl group by the generated protonic acid. A moisture curable composition containing an onium salt as an acid producing substance capable of promoting moisture-curing of a polymer having alkoxysilyl group is also disclosed in Japanese Kokai Publication 2001-515533 and it is reported that the onium salt shows photosensitivity and isolates an acid immediately after light is irirradiated.

However, an aromatic onium salt catalyst is hardly soluble in a silane compound having alkoxysilyl or alkylalkoxysilyl group and in the case the silane compound is a polymer, the catalyst is particularly inferior in solubility to make a composition opaque, so that the radiation beam hardly penetrate the composition and therefore, crosslinking or curing occurs only in the surface part where the radiation beam is irirradiated and reaction is caused and thus there is a problem that the combination of a hydrolyzable silane and an aromatic onium salt catalyst is limited.

Further, a technique for carrying out photo-crosslinking by combining benzoinsulfonate activated by light rays and a hydrolyzable silane having acryloyl group is disclosed (H. Inoue, et al., J. Photopolym. Sci., vol 12, 129-132, 1999).

Benzoinsulfonate is known as a sensitizer for photopolymerization of acryloyl groups or also a photo-initiator for starting hydrolysis and condensation reaction of the hydrolyzable silyl group. However, photopolymerization of acryloyl groups and hydrolysis and condensation reaction of the hydrolyzable silyl require UV irradiation and irradiation energy for a long time.

Japanese Kokai Publication Hei-6-273936 discloses a photosensitive resin composition containing a polysiloxane polymer obtained by hydrolysis decomposition and partial condensation of a silane compound having hydrolyzable groups and a base generating agent for generating a base by active chemical beam. However, it is generally necessary to heat at 50 to 150° C. after UV irradiation and thus it is difficult to quickly carry out polymerization to a high molecular weight at a room temperature.

SUMMARY OF THE INVENTION

It is an object of the present invention to provide a photoreactive composition in which reaction of a hydrolyzable metal compound takes place by irradiation of light.

The present invention provides a photoreactive composition which comprises a hydrolyzable metal compound (A) comprising a metal atom and a hydrolyzable functional group bonded to the metal atom and, a compound (B) promoting reaction, polymerization or crosslinking of the compound (A) in the presence of oxygen by irradiation of light.

The present invention provides a photoreactive composition which comprises a hydrolyzable metal compound (A) comprising a metal atom and a hydrolyzable functional group bonded to the metal atom and, a compound (B) having a molecular skeleton represented by the following general formula (1);

in the formula, n is an integer of 2, 3, 4 or 5; k is an integer equal to or lower than n; Y is an atom belonging to group IVB, VB or VIB in the periodic table; and Z is hydrogen or hydroxyl, mercapto group, amino, a halogen, an alkoxyl, an alkylthio, carbonyloxy or oxo group and may be the same as or different from one another; however, when Y is carbon, at least one of Z is a group having an aromatic ring or an unsaturated bond.

The above-mentioned hydrolyzable metal compound (A) is an alkoxide, phenoxide, benzyloxide, nitrate, chloride or an organic acid salt of a metal element or an organometal complex or, in the case where the hydrolyzable metal compound (A) comprises a plurality of types of metal compounds, at least one of the metal compounds is preferably an alkoxide, phenoxide, benzyloxide, nitrate, chloride, or an organic acid salt of a metal element or an organometal complex.

The photoreactive composition wherein the hydrolyzable metal compound (A) is a compound having a plurality of molecular skeletons represented by the following general formula (2) in one molecule as the hydrolyzable metal compound (A) is also one of the present invention:

in the formula, X is a hydrolyzable functional group or ligand.

In this case, the above-mentioned hydrolyzable metal compound (A) may include, for example, a compound (A1) represented by the following general formula (2-1):

$$(X)_mSi(R)_{4-m} \qquad (2-1)$$

in the formula, m is an integer of 2, 3 or 4; R is a hydrocarbon group; and X is a hydrolyzable functional group.

Further, the above-mentioned hydrolyzable metal compound (A) may include, for example, a compound (A2) having at least one or more molecular skeleton represented by the following general formula (2-2) in one molecule:

$$(X)_mSi(R)_{3-m}— \qquad (2-2)$$

in the formula, m is an integer of 1, 2 or 3; R is a hydrocarbon group; and X is a hydrolyzable functional group. In this case, the above-mentioned compound (A2) may further have a polymerizable unsaturated group. Incidentally, the polymerizable unsaturated group is preferably a radical polymerizable unsaturated group and the radical polymerizable unsaturated group is preferably methacryloyl or acryloyl group.

Further, the above-mentioned hydrolyzable metal compound (A) may include, for example, a compound (A3) having at least one or more molecular skeleton represented by the following general formula (2-2) in one molecule and also at least one kind of molecular skeletons selected from those represented by the following general formulas (2-3), (2-4), (2-5), (2-6), (2-7), and (2-8):

$$(X)_mSi(R)_{3-m}— \qquad (2-2)$$

in the formula, m is an integer of 1, 2, or 3; R is a hydrocarbon group; and X is a hydrolyzable functional group;

(2-3)

(2-4)

(2-5)

(2-6)

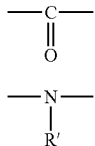

-continued (2-7)

(2-8)

in the formula, R' is hydrogen, an aliphatic hydrocarbon group, an unsaturated aliphatic hydrocarbon group, an aromatic hydrocarbon group or an alkoxyl group. Incidentally, these hydrocarbon groups may have functional groups or bonds not inhibiting crosslinking reaction of amino groups, hydroxyl groups, ether groups, epoxy groups, polymerizable unsaturated groups, urethane bonds, urea groups, imido groups, ester groups and the like.

Further, the above-mentioned hydrolyzable metal compound (A) may be obtainable from the compound (A1), the compound (A2), the compound (A3) and other hydrolyzable metal compounds in combination.

X is preferably an alkoxy group for the compound (A1), the compound (A2) or the compound (A3).

The above-mentioned compound (B) is preferably a compound (B1) represented by the following general formula (1-2) and the compound (B1) is more preferably a carboxylic acid anhydride, a carboxylic acid imide or a bisacylphosphine:

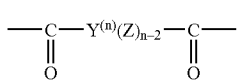

(1-2)

in the formula, n is an integer of 2, 3, 4 or 5; Y is an atom belonging to group IVB, VB or VIB in the periodic table; and Z is hydrogen or a hydrocarbon, hydroxyl, mercapto, amino, a halogen, an alkoxyl, an alkylthio, carbonyloxy or oxo group.

The photoreactive composition of the present invention may further contain a photoradical generation agent (C).

The photoreactive composition of the present invention may further contain a hydrogen radical supplying agent (D).

The photoreactive composition of the present invention may further contain an organometal compound (E) for promoting hydrolysis and condensation reaction of the compound (A1), the compound (A2) and the compound (A3).

The photoreactive composition of the present invention may further contain a compound (F) having a polymerizable group. With respect to the compound (F) having a polymerizable group, the polymerizable group is preferably a radical polymerizable unsaturated group and the radical polymerizable unsaturated group is preferably acryloyl or methacryloyl group. Further, the polymerizable group is preferably a cationic polymerizable group. In this case, the above-mentioned compound (F) is more preferable to have the cationic polymerizable group and a functional group represented by the following general formula (2-2):

$(X)Si(R)_{3-m}$— (2-2)

in the formula, m is an integer of 1, 2 or 3; R is a hydrocarbon group; and X is a hydrolyzable functional group. The above-mentioned compound (F) is preferably a compound having a vinyloxy group. Further, in this case, a compound which polymerizes or crosslinks the compound (F) having a cationic polymerizable group by irradiation of light may be contained.

Further, in the case where the photoreactive composition of the present invention contains the compound (F) having the above-mentioned polymerizable group, the composition may further contain a polymerization initiator for the compound (F).

The photoreactive composition of the present invention may further contain a group (G) having an epoxy group. The above-mentioned compound (G) may be a compound having a functional group represented by the following general formula (2-2):

$(X)_m Si(R)_{3-m}$— (2-2)

in the formula, m is an integer of 1, 2 or 3; R is a hydrocarbon group; and X is a hydrolyzable functional group. In this case, the above-mentioned compound (G) may be a compound having 3 or more epoxy groups in one molecule.

The photoreactive composition of the present invention may contain a compound producing one silanol group in one molecule by hydrolysis or a compound having one silanol group in one molecule.

It is further preferable for the photoreactive composition of the present invention to contain oxygen.

With respect to a method for curing the photoreactive composition of the present invention, a method for curing the photoreactive composition comprising a step of bringing a gas containing oxygen gas into contact with the above-mentioned photoreactive composition irradiated with light is also one of the present invention.

A product which is obtainable by irradiating light to a photoreactive composition of the present invention is also one of the present invention.

The present invention may include a photoreactive post-curing composition which is obtainable by using the photoreactive composition, a photoreactive adhesive composition, a photoreactive sealing agent composition, a photoreactive pattern forming material composition, a photoreactive coating composition and a coating obtained by irradiating light to it, a conductive material composition and a conductive material obtained by irradiating light to it, an insulating material composition and an insulating material obtained by irradiating light to it, a semiconductor material composition and a semiconductor material obtained by irradiating light to it, a high dielectric constant material composition and a high dielectric constant material obtained by irradiating light to it, a low dielectric constant material composition and a low dielectric constant material obtained by irradiating light to it, a transparent and conductive material composition and a transparent and conductive material obtained by irradiating light to it, a material for an anti-reflection layer and an anti-reflection layer obtained by irradiating light to it, A partitioning wall material composition for PDP and EL elements and a partition obtained by irradiating light to it, a microlens composition and a microlens obtained by irradiating light to it, a resist material composition and a resist material obtained by irradiating light to it, an optical fiber material composition and an optical fiber material obtained by irradiating light to it, a color filter material composition and a material obtained by irradiating light to it, a seal material composition and a seal material obtained by irradiating light to it, a gas permeable film composition and a gas permeable film obtained by irradiating light to it, and a gas barrier film composition and a gas barrier film obtained by irradiating light to it.

DETAILED DISCLOSURE OF THE INVENTION

Hereinafter, the present invention is described in detail.

A photoreactive composition of the present invention comprises a hydrolyzable metal compound (A) and a compound (B) promoting reaction, polymerization or crosslinking of the hydrolyzable metal compound (A) in the presence of oxygen by irradiation of light.

The above-mentioned hydrolyzable metal compound (A) comprises a metal atom and a hydrolyzable functional group bonded to the metal atom. The hydrolyzable metal compound (A) may be used alone or in combination of a plurality of kinds. A mixture of an inorganic material and an organic material may be used and also a hybrid organic-inorganic material having both an inorganic skeleton and an organic skeleton may be used.

The above-mentioned metal atom is not particularly limited and may include, for example, Li, Be, B, C, Na, Mg, Al, Si, P, K, Ca, Sc, Ti, V, Cr, Mn, Fe, Co, Ni, Cu, Zn, Ga, Ge, As, Rb, Sr, Y, Zr, Nb, Mo, Cd, In, Sn, Sb, Cs, Ba, La, Hf, Ta, W, Hg, Tl, Pb, Bi, Ce, Pr, Nd, Pm, Sm, Eu, Gd, Tb, Dy, Ho, Er, Tm, Yb, Lu, Th, Pa, U, Pu and the like.

The above-mentioned hydrolyzable functional group is not particularly limited and may include preferably, for example, an alkoxy group, a phenoxy group, a benzyloxy group, a nitric acid group, a chlorine, an organic acid group, a ligand for forming a complex and the like.

The above-mentioned alkoxy group may include, for example, methoxy, ethoxy, propyloxy, isopropyloxy, butoxy, tert-butoxy group and the like. The above-mentioned ligand for forming a complex may include well-known ligands, for example, ethylenediamine, oxine, bipyridyl, butadiene, cyclopenetadiene and the like.

Incidentally, in these ligands, hydrogen atoms may be replaced with fluorine atoms.

The above-mentioned hydrolyzable metal compound (A) may include, for example, an alkoxide, phenoxide, benzyloxide, nitrate, chloride, or an organic acid salt of a metal element or an organometal complex. Further, the above-mentioned hydrolyzable metal compound (A) may comprise a plurality of metal compounds and in such a case, at least one of the metal compounds is preferably an alkoxide, phenoxide, benzyloxide, nitrate, chloride or an organic acid salt of a metal element or an organometal complex.

The above-mentioned organic acid salt of a metal element may include, for example, a salt of an above exemplified metal and a carboxylic acid. The carboxylic acid may include, for example, formic acid, acetic acid, propionic acid, butyric acid, isobutyric acid, valeric acid, 2-methylbutylic acid, trimethylacetic acid, hexanoic acid, heptanoic acid, octylic acid, decanoic acid, laurylic acid, myristic acid, palmitic acid, stearic acid, oxalic acid, succinic acid, itaconic acid, maleic acid, glutaric acid and the like.

The above-mentioned hydrolyzable metal compound (A) may include, for example, aluminum butoxide, aluminum acetylacetonate, aluminum dibutoxide ethylacetoacetate, aluminum acrylate, aluminum phenoxide, aluminum stearate, aluminum hexafluoroacetylacetonate, dibutoxyaluminoxytriethoxysialne, aluminum magnesium isopropoxide, antimony acetate, antimony butoxide, tris(dimethylamino) antimony, trietoxyarsenic, tris(dimethylamino)aresenic, barium acetate, barium acrylate, barium propoxide, barium acetylacetonate, beryllium acetylacetonate, bismuth hexafluoroacetylacetonate, bismuth neodecanoate, bismuth pentoxide, boron methoxide, boron ethoxide, boron allyloxide, cadmium acetate, cadmium acetylacetonate, calcium acetate, calcium acrylate, calcium ethoxide, calcium gluconate, calcium hexafluoroacetylacetonate, calcium acetylacetonate, cesium acetate, cesium methoxide, cesium acetylacetonate, chromium acetate, chromium benzoylacetonate, chromium hexafluoroacetylacetonate, chromium propoxide, chromium acetylacetonate, cobalt acetate, cobalt acetylacetonate, octacarbonyl dicobalt, copper benzoylacetate, copper benzoylfluoroacetate, copper dimethylaminoethoxide, copper ethoxide, copper hexafluoroacetylacetonate, copper hexafluoroacetylacetonato-2-butine, copper acetylacetonate, diethyl gallium chloride, gallium acetylacetonate, gallium ethoxide, gallium tris[bis(trimethylsilyl)amide], allyltrichlorogermanium, bis[bis(trimethylsilyl)amino]germanium, ethyltriethoxygermanium, methyltrichlorogermanium, tetrabutoxygermanium, methyltriethoxgermanium, hafnium butoxide, hafnium dimethylamide, hafnium acetylacetonate, hafnocene dichloride, indium acetylacetonate, indium hexafluoroacetylacetonate, indium methoxyethoxide, iridium acetylacetonate, iridium cyclooctadiene chloride, iridium dicarbonyl acetylacetonate, iron acetate, iron ethoxide, iron methacrylate, iron acetylacetonate, lead acetate, lead acrylate, lead hexafluoroacetylacetonate, lead acetylacetonate, lithium acrylate, lithium ethoxide, lithium acetylacetonate, magnesium acrylate, magnesium ethoxide, magnesium acetylacetonate, manganese acetate, manganese acetylacetonate, mercury acetate, molybdenum ethoxide, molybdenum acetylacetonate, nickel acetate, nickel acetylacetonate, niobium butoxide, niobium ethoxide, palladium acetate, palladium acetylacetonate, palladium trifluoroacetate, triethylphosphate, tris(trimethoxysilyl)phosphite, titanium tris (dioctylphosphate)isopropoxide, potassium acetate, potassium benzoate, potassium butoxide, potassium acetylacetonate, cerium butoxide, cerium oxalate, cerium acetylacetonate, europium acetylacetonate, europium acetate, gadolinium acetate, gadolinium acetylacetonate, holmium acetylacetonate, holmium tetramethylheptanedionate, lanthanum methoxyethoxide, lanthanum acetate, lanthanum acetylacetonate, lutetium acetylacetonate, neodymium acetate, neodymium acetylacetonate, neodymium methoxethoxide, praseodymium methoxethoxide, praseodymium acetylacetonate, samarium isopropoxide, samarium acetylacetonate, scandium acetylacetonate, terbium acetylacetonate, terbium acetate, ytterbium acetylacetonate, ytterbium trifluoroacetylacetonate, yttrium propoxide, yttrium acetylacetonate, yttrium trifluoroacetate, rubidium acetylacetonate, silver acetylacetonate, silver acrylate, sodium acetate, sodium butoxide, sodium itaconate, sodium methylacetoacetate, sodium acetylacetonate, tantalum butoxide, tantalum sodium methoxide, tantalum tetramethoxide acetylacetonate, thallium benzoylacetate, thallium ethoxide, thallium acetylacetonate, tin acetylacetonate, butyltrichlorotin, tin acetate, sodium tin ethoxide, tin butoxide, titanium propoxide, titanium dichloride diethoxide, titanium acetylacetonate, titanium diisopropoxidoacetylacetonate, titanium phenoxide, titanium methylphenoxide, titanium tetrakis (dimethylamide), methyltitanium tripropoxide, pentamethylcyclopentadienyltitanium trimethoxide, pentamethylcyclopentadienyltitanium trichloride, titanium triisopropoxide tributylstannoxide, titanocene dichloride, titanium chloride, tungsten ethoxide, tungsten phenoxide, vanadium oxide acetylacetonate, vanadium tributoxide oxide, zinc acetate, zinc acrylate, zinc methoxyethoxide, zinc acetylacetonate zirconium butoxide, methylzirconocene, zirconium chloride bis(acetylacetonate), zirconium methacrylate, zirconium acetylacetonate, zirconocene dichloride and the like.

Among these compounds for the hydrolyzable metal compound (A), those containing Si as a metal element can give cured body with hardness varying in an extremely wide range covering from hard and fragile properties to soft and elastic properties after being polymerized or crosslinked. Moreover, extremely viscous materials just like grease and sticky materials can also be obtained as the cured bodies. Owing to such properties, these compounds can be used widely for industrial uses such as a coating material, grease, a pressure sensitive adhesive, an adhesive, a sealing material, an elastomer, a mold-releasing agent and the like.

That is, in the case where the above-mentioned hydrolyzable metal compound (A) is a compound having a plurality of molecular skeletons represented by the following general formula (2) in one molecule, it is particularly industrially useful:

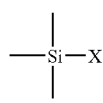
(2)

in the formula, X is a hydrolyzable functional group or ligand (hereinafter, referred to as a hydrolyzable group (X) in some cases).

The compound having a plurality of molecular skeletons represented by the above-mentioned general formula (2) in one molecule include those having molecular skeletons in which a plurality of hydrolyzable groups (X) are bonded via same silicon atoms.

The above-mentioned hydrolyzable group (X) is a functional group of which a bond between a silicon atom and the hydrolyzable group (X) is cut by hydrolysis reaction. The above-mentioned hydrolyzable group (X) is not particularly limited and may be a known functional group, for example, an alkoxy, an oxime, an alkenyloxime, an acetoxy group, a halogen such as chlorine, bromine, and the like. Above all, in terms of the storage stability and wide availability, an alkoxy group is preferable. The alkoxy group is not particularly limited and may include, for example, methoxy, ethoxy, propyloxy, isopropyloxy, butoxy, tert-butoxy, phenoxy, benzyloxy group and the like. In the case of a dialkoxysilyl or a trialkoxysilyl group, same alkoxy groups may be used or different alkoxy groups may be used in combination. The hydrolyzable group (X) of the compound (A) may be all same or different.

A compound represented by the above-mentioned general formula (2) is not particularly limited and may include, for example, a compound (A1) represented by the following general formula (2-1) having 2 to 4 hydrolyzable groups (X) bonded to a silicon atom, a compound (A2) having at least one or more molecular skeleton represented by the following general formula (2-2) in one molecule and a compound (A3) having at least one or more molecular skeleton represented by the following general formula (2-2) in one molecule and also at least one kind of molecular skeletons selected from those represented by the following general formulas (2-3), (2-4), (2-5), (2-6), (2-7) and (2-8). Incidentally, in the following general formula (2-2), when m is 1, the compound (A2) has at least 2 skeletons represented by the general formula (2-2) in one molecule. Furthermore, mixtures of the compound (A1), the compound (A2), the compound (A3), and other hydrolyzable metal compounds in combination may be included.

$(X)_mSi(R)_{4-m}$ (2-1)

in the formula, m is an integer of 2, 3 or 4; R is a hydrocarbon group; and X is a hydrolyzable functional group.

$(X)_mSi(R)_{3-m}—$ (2-2)

in the formula, m is an integer of 1, 2 or 3; R is a hydrocarbon group; and X is a hydrolyzable functional group.

With respect to the above-mentioned general formulas (2-1) and (2-2), a hydrocarbon group denoted as R (hereinafter, referred to as hydrocarbon group R) is not particularly limited and may include, for example, an aliphatic hydrocarbon group, an unsaturated aliphatic hydrocarbon group, an aromatic hydrocarbon group and the like. These hydrocarbon groups may be partially substituted with an amino group, a hydroxy group, an ether group, an epoxy group, a polymerizable unsaturated group, an urethane bond, a urea group, an imido group, an ester bond, a carbonate bond, an isocyanate group, an oxetanyl group, an imino group, a halogen such as fluorine, chlorine, bromine, iodine and the like; and a functional group or bond which does not inhibit the reaction of siloxane bonds. A plurality of types of these functional groups or bonds may be used for substitution.

(2-3)

(2-4)

(2-5)

(2-6)

(2-7)

(2-8)

in the formula, R' is hydrogen, an aliphatic hydrocarbon group, an unsaturated aliphatic hydrocarbon group, an aromatic hydrocarbon group or an alkoxyl group. Incidentally, these hydrocarbon groups may have functional groups or bonds which do not inhibit crosslinking reaction of amino groups, hydroxyl, ether groups, epoxy groups, polymerizable unsaturated groups, urethane bonds, urea groups, imido groups, ester groups and the like.

The above-mentioned compound (A1) may include, for example, dimethoxydimethylsilane, cyclohexyldimethoxymethylsilane, diethoxydimethylsilane, dimethoxymethyloctylsilane, diethoxymethylvinylsilane, chloromethyl(diisopropoxy)methylsilane, dimethoxymethylphenylsilane, diethoxydiphenylsilane, trimethoxysilane, triethoxysilane, methyltrimethoxysilane, trimethoxypropylsilane, isobutyltrimethoxysilane, octyltrimethoxysilane, octadecyltrimethoxysilane, methyltriethoxysilane, ethyltriethoxysilane, isobutyltriethoxysilane, octyltriethoxysilane, vinyltrimethoxysilane, vinyltriethoxysilane, allyltriethoxysilane, (3-chloropropyl)trimethoxysilane, chloromethyltriethoxysilane, tris(2-methoxyethoxy)vinylsilane, 3-glycidoxypropyltrimethoxysilane, diethoxy(3-glycidoxypropyl)methylsilane, trimethoxy[2-(7-oxabicyclo[4.1.0]-hepto-3-yl)ethyl]silane, chlorotrimethoxysilane, chlorotriethoxysilane, chlorotris(1,3-dimethylbutoxy)silane, dichlorodiethoxysilane, 3-(triethoxysilyl)-propionitrile, 4-(triethoxysilyl)-butyronitrile, 3-(triethoxysilyl)-propyl isocyanate, 3-(triethoxysilyl)-propyl thioisocyanate, phenyltrimethoxysilane, phenyltriethoxysilane, tetramethoxysilane, tetraethoxysilane, tetrapropoxysilane, tetrabutoxysilane, 1,3,5,7-tetraethoxy-1,3,5,7-tetramethylcyclotetrasiloxane, 1,3,5,7-tetramethyl-1,3,5,7-tetrapropoxycyclotetrasiloxane, 1,3,5,7-tetraisopropoxy-1,3,5,7-tetramethylcyclotetrasiloxane, 1,3,5,7-tetrabutoxy-1,3,5,7-tetramethylcyclotetrasiloxane, 1,3,5,7,9-pentaethoxy-1,3,5,7,9-pentamethylcyclotetrasiloxane, octamethylcyclotetrasiloxane, decamethylcyclopentasiloxane, dodecamethylcyclohexasiloxane, hexaphenylcyclotrisiloxane, octaphenylcyclotetrasiloxane, 1,3,5,7-tetramethylcyclotetrasiloxane, 1,3,5,7-tetramethyl-1,3,5,7-tetraphenylcyclotetrasiloxane, 1,1,3,3,5,5-hexamethylcyclotrisilazane, 1,1,3,3,5,5,7,7-octamethylcyclotetrasilazane, 1,7-diacetoxyoctamethyltetrasiloxane, 1,7-dichlorooctamethyltetrasiloxane, 1,1,3,3,5,5,-hexamethyl-1,5-dichlorotrisiloxane, 1,3-dichlorotetraisopropyldisiloxane, 1,3-diethoxytetramethyldisiloxane, 1,3-dimethoxytetramethyldisiloxane, 1,1,3,3-tetramethyl-1,3-dichlorodisiloxane, 1,2-bis(methyldichlorosilyl)ethane, diacetoxydiphenylsilane, methyltris(ethylmethylketoxime)silane, methyltris(N,N-diethylaminoxy)silane, bis(ethylmethylketoxime)methylisopropoxysilane, bis(ethylmethylketoxime)ethoxymethylsilane, 2-(3,4-epoxycyclohexylethyl)trimethylsilane, tris(1-methylvinyloxy)vinylsilane, methyltriisopropenoxysilane, ethyltriacetoxysilane, methyltriacetoxysilane, diacetoxydimethylsilane, triacetoxyvinylsilane, tetraacetoxysilane, diacetoxymethylphenylsilane, dimethoxyethylmethylketoximemethylsilane, and the like.

The above-mentioned compound (A2) may include, for example, a polymer having a molecular skeleton represented by the general formula (2-2) and polymers having alkylene glycol as a monomer unit such as propylene glycol, ethylene glycol, butylene glycol and the like; polymers such as polyesters, polyamides, polyimides, polycarbonates, polymethacrylates, polyacrylates, polystyrenes, polyolefins and the like; and their copolymers.

The molecular skeleton represented by the general formula (2-2) and contained in the above-mentioned compound (A2) may be, for example, dimethoxymethylsilyl, cyclohexyldimethoxysilyl, diethoxymethylsilyl, dimethoxoctylsilyl, diethoxyvinylsilyl, chloromethyl(diisopropoxy)silyl, dimethoxyphenylsilyl, diethoxyphenylsilyl, trimethoxysilyl, triethoxysilyl, dimethoxypropylsilyl, isobutyldimethoxysilyl, octyldimethoxsilyl, octadecyldimethoxsilyl, methyldiethoxysilyl, ethyldiethoxysilyl, isobutyldiethoxysilyl, octyldiethoxysilyl, vinyldimethoxysilyl, vinyldiethoxysilyl, allyldiethoxysilyl, (3-chloropropyl)dimethoxysilyl, chloromethyldiethoxysilyl, bis(2-methoxyethoxy)vinylsilyl, 3-glycidoxypropyldimethoxysilyl, diethoxy(3-glycidoxypropyl)silyl, dimethoxy[2-(7-oxabicyclo[4,1,0]-hepto-3-yl)ethyl]silyl, chlorodimethoxysilyl, chlorodiethoxysilyl, chlorobis(1,3-dimethylbutoxy)silyl, chlorodiethoxysilyl, 3-(triethoxysilyl)-propionitrile, 4-(triethoxysilyl)-butyronitrile, 3-(triethoxysilyl)-propyl isocyanate, 3-(triethoxysilyl)-propyl thioisocyanate, phenyldimethoxsilyl, phenyldiethoxysilyl, trimethoxysilyl, triethoxysilyl, tripropoxysilyl, tributoxysilyl, 1,2-bis(methyldichlorosilyl), diacetoxydiphenylsilyl, methyltris(ethylmethylketoxime)silyl, methyltris(N,N-diethylaminoxy)silyl, bis(ethylmethylketoxime)methylisopropoxysilyl, bis(ethylmethylketoxime)ethoxymethylsilyl, 2-(3,4-epoxycyclohexylethyl)trimethylsilyl, tris(1-methylvinyloxy)vinylsilyl, methyltriisopropenoxysilyl, ethyltriacetoxysilyl, methyltriacetoxysilyl, diacetoxydimethylsilyl, triacetoxyvinylsilyl, tetraacetoxysilyl, diacetoxymethylphenylsilyl, dimethoxyethylmethylketoximemethylsilyl group and the like.

With respect to the above-mentioned compound (A2), the molecular skeleton represented by the general formula (2-2) may be positioned at a terminal of a polymer or at a side chain of a polymer. Further, it may be positioned at both of a terminal and a side chain of a polymer. The structure of a polymer may be a straight chain structure, multi-branched structure such as a star-shape, a combteethed shape, a dendriform shape and the like, a graft structure, a cyclic structure, a ladder structure, a catenane structure or a structure formed by combination of these structures. The segment structure contained in the polymer may be a structure composed of single monomer units; a structure composed of a plurality of monomer units arranged at random, reciprocally, or block-like shape; or the like.

The above-mentioned compound (A2) may further contain a polymerizable unsaturated group. The foregoing polymerizable unsaturated group may be an anionic polymerizable group such as styryl, (meth)acryl group and the like; a cationic polymerizable group such as styryl, vinyloxy group and the like; and a radical polymerizable unsaturated group. Above all, a radical polymerizable unsaturated group is more preferable.

The above-mentioned radical polymerizable unsaturated group is a functional group having a double or higher carbon-carbon bond chemically reactive in such a manner that when it receives radical attack, it causes chain reaction on another unsaturated group by the radical produced by the radical attack and successively produces radical. Methacryloyl or acryloyl group is preferable as such a radical polymerizable unsaturated group.

The above-mentioned compound (A2) may be a compound having a plurality of and/or a plurality of types of molecular skeletons represented by the above-mentioned general formula (2-2) and/or radical polymerization groups in combination. Further, a plurality of the compounds (A2) can be used in combination. The compound (A2) having the molecular skeletons represented by the above-mentioned general formula (2-2) and radical polymerization groups may include, for example, N-(3-acryloyloxy-2-hydroxypropyl)-3-aminopropyltriethoxysilane, 3-acryloyloxypropyldimethylmethoxysilane, 3-acryloyloxypropylmethyldimethoxysilane, 3-acryloyloxypropyltrimethoxysilane, 3-acryloyloxypropylmethylbis(trimethylsiloxy)silane, allyltriethoxysilane, allyltrimethoxysilane, 3-allylaminopropyltrimethoxysilane, 3-methacryloyloxypropyldimethylmethoxysilane, 3-methacryloyloxypropyldimethylethoxysilane, 3-methacryloyloxypropylmethyldimethoxysilane, 3-methacryloyloxypropylmethyldiethoxysilane, 3-methacryloyloxypropyltrimethoxysilane, 3-methacryloyloxypropenyltrimethoxysilane, vinylmethyldiacetoxysilane, vinyltriacetoxysilane, vinyldimethylmethoxysilane, vinyldimethylethoxysilane, vinylmethyldiethoxysilane, vinyltrimethoxysilane, vinyltriethoxysilane, vinyltriisopropxysilane, vinyltriphenoxysilane, vinyldimethylisopentenyloxysilane, vinyldimethyl-2-((2-ethoxyethoxy)ethoxy)silane, vinyltris(1-methylvinyloxy)silane, vinyltris(2-methoxyethoxy)silane, phenylvinyldiethoxysilane, diphenylvinylethoxysilane, 6-triethoxysilyl-2-norbornene, oct-7-enyltrimethoxysilane, styrylethyltrimethoxysilane and the like.

The above-mentioned compound (A3) may include, for example, low molecular weight compounds such as bis(trimethoxysilyl)benzene, bis(triethoxysilyl)benzene, tris(trimethoxysilyl)benzene, tris(triethoxysilyl)benzene, bis(trimethoxysilyl)biphenyl, bis(triethoxysilyl)biphenyl, tris(trimethoxysilyl)biphenyl, tris(triethoxysilyl)biphenyl, bis(trimethoxysilyl)naphthalene, bis(triethoxysilyl)naphthalene, tris(trimethoxysilyl)naphthalene, tris(triethoxysilyl)naphthalene, bis(methyldimethoxysilyl)benzene, bis(methyldiethoxysilyl)benzene, tris(methyldimethoxysilyl)benzene, tris(methyldiethoxysilyl)benzene, bis(methyldimethoxysilyl)biphenyl, bis(methyldiethoxysilyl)biphenyl, tris(methyldimethoxysilyl)biphenyl, tris(methyldiethoxysilyl)biphenyl, bis(methyldimethoxysilyl)naphthalene, bis(methyldiethoxysilyl)naphthalene, tris(methyldimethoxysilyl)naphthalene, tris(methyldiethoxysilyl)naphthalene, tris(dimethylmethoxysilyl)benzene, tris(dimethylmethoxysilyl)biphenyl, tris(dimethylmethoxysilyl)naphthalene, bis(trimethoxysilylethinyl)benzene, bis(methyldiethoxysilylethinyl)benzene, tris(trimethoxysilylethinyl)benzene, tris(methyldimethoxysilylethinyl)benzene, bis(trimethoxysilylpropyl)benzene, bis(methyldiethoxysilylpropyl)benzene, tris(trimethoxysilylpropyl)benzene, tris(methyldimethoxysilylpropyl)benzene, bis(trimethoxysilyl)methane, bis(methyldimethoxysilyl)methane, bis(trimethoxysilyl)ethane, bis(methyldimethoxysilyl)ethane, bis(trimethoxysilyl)propane, bis(methyldimethoxysilyl)propane, bis(trimethoxysilyl)butane, bis(methyldimethoxysilyl)butane, bis(trimethoxysilyl)pentane, bis(methyldimethoxysilyl)pentane, bis(trimethoxysilyl)hexane, bis(methyldimethoxysilyl)hexane, bis(trimethoxysilyl)heptane, bis(methyldimethoxysilyl)heptane, bis(trimethoxysilyl)octane, bis(methyldimethoxysilyl)octane, bis(trimethoxysilylpropyl)amine, bis(methyldimethoxysilylpropyl)amine, bis(trimethoxysilylpropyl)ethylenediamine, bis(methydimethoxysilylpropyl)ethylenediamine, tris(trimethoxysilylpropyl)isocyanurate, hexamethoxydisilane, methyldimethoxydisilane, hexaethoxydisilane, methyldiethoxydisilane, dimethoxytetramethyldisiloxane, trimethoxytrimethyldisiloxane, tetramethoxydimethyldisiloxane, pentamethoxymethyldisiloxane, hexamethoxydisiloxane, dimethoxyhexamethyltrisiloxane, trimethoxypentamethyltrisiloxane, tetramethoxytetramethyltrisiloxane, pentamethoxytrimethyltrisiloxane, hexamethoxydimethyltrisiloxane, heptamethoxymethyltrisiloxane, octamethoxytrisiloxane, 1,3,5,7-tetramethoxy-1,3,5,7-tetramethylcyclotetrasiloxane, octamethoxycyclotetrasiloxane, 1,3,5,7-tetraethoxy-1,3,5,7-tetramethylcyclotetrasiloxane, octaethoxycyclotetrasiloxane, octakis(trimethoxysilylethinyl)-T8-silsesquioxane, octakis(methyldimethoxysilylethinyl)-T8-silsesquioxane, octakis(dimethylmethoxysilylethinyl)-T8-silsesquioxane, and the like; polymers and oligomers such as polysilanes, polysiloxanes, polysilazanes, polyolefins, polyethers, polyesters, polycarbonates, polyamides and the like; and their copolymers.

Those commercialized among the above-mentioned compounds represented by the general formula (2) are, for example, as trade name MS polymer produced by Kanegafuchi Chemical Industry Co., Ltd., MS polymer S-203, S-303, Epion and the like; as silyl polymers, Silyl SAT-200, MA-903, MA-447 and the like; as polymers produced by Asahi Glass Co., Ltd., Excestar ESS-2410, ESS-2420, ESS-3630; as polymers produced by Chisso Corporation, acetoxy-terminated polydimethylsiloxane (PS363.5), dimethylamino-terminated polydimethylsiloxane (PS383), ethoxy-terminated polydimethylsiloxane, (PS393), stearyloxy-terminated polydimethylsiloxane (PS053.5), triethoxysilyl-modified poly(1,2-butadiene) (PS078.5), (N-trimethoxysilylpropyl)polyazamide (PS075), (N-trimethoxysilylpropyl)polyethyleneimine (PS076), (N-trimethoxysilylpropyl)-O-polyethylene oxide urethane (PS077) and the like.

The above-mentioned compound (B) has a property of reaction, polymerization or crosslinking of the hydrolyzable metal compound (A) in the presence of oxygen by irradiation of light.

In the case of using a conventional cation type polymerization initiator, the reaction in the presence of oxygen is sometimes inhibited in relation to the reaction mechanism. However, on the basis of investigations, inventors of the present invention have found that owing to use of a specified compound (B), not only the polymerization or crosslinking reaction of the hydrolyzable metal compound is not inhibited by oxygen but also it is promoted by oxygen. Use of the compound (B) makes it possible to promote reaction, polymerization, and crosslinking of the hydrolyzable metal compound without requiring a step of removing oxygen by replacement with nitrogen or the like and that brings great advantage in industrial fields.

The above-mentioned compound (B) may include, for example, those having a molecular skeleton represented by the following general formula (1):

In the formula (1), n is an integer of 2, 3, 4 or 5; k is an integer equal to or lower than n; Y is an atom belonging to group IVB, VB or VIB in the periodic table; and Z is hydrogen or hydroxyl, mercapto, amino, a halogen, an alkoxyl, an alkylthio, carbonyloxy or oxo group and may be the same as or different from one another.

However, when Y is carbon, at least one of Z is a group having an aromatic ring or an unsaturated bond. When Y is carbon, sufficient reactivity to a hydrolyzable metal compound comprising Si as a metal atom cannot be expected in some cases. However, when Z is a group having an aromatic ring or an unsaturated bond, the molecular skeleton represented by the general formula (1) is activated by X electron in the aromatic ring or the unsaturated bond and sufficient reactivity to the hydrolyzable metal compound comprising Si as a metal atom can be obtained.

As an atom belonging to Group IVB elements, C, Si, Ge, Sn, and Pb can be exemplified: as an atom belonging to group VB in the periodic table, N, P, As, Sb, and Bi can be exemplified: and as an atom belonging to Group VIB elements, O, S, Se, Te, and Po can be exemplified:

The above-mentioned compound (B) is especially preferably a compound (B1) represented by the following general formula (1-2):

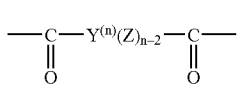 (1-2)

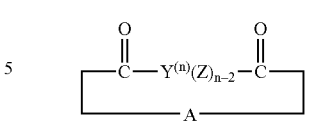 (1-3)

in the formula, n is an integer of 2, 3, 4 or 5; Y is an atom belonging to group IVB, VB or VIB elements; and Z is hydrogen or a hydrocarbon, hydroxyl, mercapto, amino, a halogen, an alkoxyl, an alkylthio, carbonyloxy or oxo group.

The molecular skeleton represented by the above-mentioned general formula (1-2) comprises the atom Y selected from group IVB, VB or VIB in the periodic table, that is, oxygen, sulfur, nitrogen, phosphorus, and carbon and hydrogen, a hydrocarbon, hydroxyl, mercapto, amino, a halogen, an alkoxyl, an alkylthio, carbonyloxy, or oxo group as a substituent group Z for the atom Y corresponding to the valence of the atom Y.

The hydrocarbon group for the above-mentioned Z may include, for example, an aliphatic hydrocarbon group, an unsaturated hydrocarbon group, an aromatic hydrocarbon group and the like. These hydrocarbon groups may have functional groups or bonds which do not inhibit crosslinking reaction of amino groups, hydroxyl, ether groups, epoxy groups, polymerizable unsaturated groups, urethane bonds, urea groups, imido groups, ester groups and the like.

The molecular skeleton represented by the above-mentioned general formula (1-2) may include, for example, functional groups represented by the following general formulas (1-2A), (1-2B), (1-2C), (1-2D), and (1-2E):

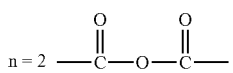 (1-2A)

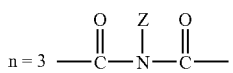 (1-2B)

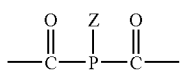 (1-2C)

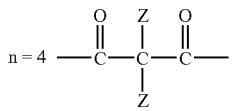 (1-2D)

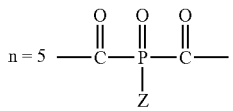 (1-2E)

Further, the above-mentioned compound (B1) may include, for example, cyclic compounds represented by the following general formula (1-3) and compounds having a plurality of the same type or different types of molecular skeletons represented by the above-mentioned general formula (1) in a single cyclic chain as shown in the following general formula (1-3). Further, compounds comprising a plurality of the same type or different types of such cyclic compounds bonded to one another by proper organic groups and bicyclic compounds containing at least one unit comprising a plurality of the same type or different types of these cyclic compounds can be also exemplified.

In the formula, n is an integer of 2, 3, 4 or 5; Y is an atom belonging to group IVB, VB or VIB in the periodic table; Z is hydrogen or a hydrocarbon, hydroxyl, mercapto, amino, a halogen, an alkoxyl, an alkylthio, carbonyloxy or oxo group and may be the same as or different from one another; and A is an organic group.

When Y is oxygen, the above-mentioned compound (B1) may include, for example, acetic anhydride, propionic anhydride, butyric anhydride, isobutyric anhydride, valeric anhydride, 2-methylbutyric anhydride, trimethylacetic anhydride, hexanoic anhydride, heptanoic anhydride, decanoic anhydride, lauric anhydride, myristic anhydride, palmitic anhydride, stearic anhydride, docosanoic anhydride, crotonic anhydride, acrylic anhydride, methacrylic anhydride, oleic anhydride, linolenic anhydride, chloroacetic anhydride, iodoacetic anhydride, dichloroacetic anhydride, trifluoroacetic anhydride, chlorodifluoroacetic anhydride, trichloroacetic anhydride, pentafluoropropionic anhydride, heptafluorobutyric anhydride, succinic anhydride, methylsuccinic anhydride, 2,2-dimethylsuccinic anhydride, isobutylsuccinic, 1,2-cyclohexanedicarboxylic anhydride, hexahydro-4-methylphthalic anhydride, itaconic anhydride, 1,2,3,6-tetrahydrophthalic anhydride, 3,4,5,6-tetrahydrophthalic anhydride, maleic anhydride, 2-methylmaleic anhydride, 2,3-dimethylmaleic anhydride, 1-cyclopentene-1,2-dicarboxylic anhydride, glutaric anhydride, 1-naphthylacetic anhydride, benzoic anhydride, phenylsuccinic anhydride, phenylmaleic anhydride, 2,3-diphenylmaleic anhydride, phthalic anhydride, 4-methylphthalic anhydride, 3,3',4,4'-benzophenonetetracarboxylic dianhydride, 4,4'-(hexafluoropropylidene)diphthalic anhydride, 1,2,4,5-benzenetetracarboxylic anhydride, 1,8-naphthalenedicarboxylic anhydride, 1,4,5,8-naphthalenetetracharboxylic anhydride, and the like; copolymers of maleic anhydride and compounds having radical polymerizable double bonds; copolymers of maleic anhydride and (meth)acrylates; copolymers of maleic anhydride and styrene; copolymers of maleic anhydride and vinyl ethers; and the like.

Those commercialized among the above-mentioned compounds (B1) are, for example, Adeka Hardener EH-700, Adeka Hardener EH-703, and Adeka Hardener EH-705A produced by Asahi Denka Kogyo K.K.; Rikacid TH, Rikacid HT-1, Rikacid HH, Rikacid MH-700, Rikacid MH-700H, Rikacid MH, Rikacid SH and Rikaresin TMEG produced by New Japan Chemical Co., Ltd.; HN-5000 and HN-2000 produced by Hitachi Chemical Co., Ltd.; Epikure 134A, Epikure YH306, Epikure YH307, and Epikure YH308H produced by Yuka Shell Epoxy K.K.; and Sumicure MS produced by Sumitomo Chemical Co., Ltd.

When Y is sulfur, the above-mentioned compound (B1) may include, for example, diacetylsulfide represented by the following general formula (1-4), thioacetic anhydride, thiopropionic anhydride, thiobutyric anhydride, thioisobutyric anhydride, thioveleric anhydride, thiotrimethylacetic anhydride, thiohexanoic anhydride, thioheptanoic anhydride, thiodecanoic anhydride, thiolaurylic anhydride, thiomyristic anhydride, thiopalmitic anhydride, thiostearic anhydride, thiodocosanoic anhydride, thiocrotonic anhydride, thioacrylic anhydride, thiomethacrylic anhydride, thiooleic anhydride, thiolinolenic anhydride, thiochloroacetic anhydride, thioiodoacetic anhydride, thiodichloroacetic anhydride, thiotrifluoroacetic anhydride, thiochlorodifluoroacetic anhydride, thiotrichloroacetic anhydride, thiopentafluoropropionic anhydride, thioheptafluorobutyric anhydride, thiosuccinic anhydride, thiomethylsuccinic anhydride, thioisobutylsuccinic, thioitaconic anhydride, thiomaleic anhydride, thioglutaric anhydride, thiophenylsuccinic anhydride, thiophenylmaleic anhydride, thiophthalic anhydride, thiobenzoic anhydride, thiodiglycol anhydride, thiolactic anhydride and the like.

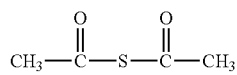

(1-4)

When Y is nitrogen, the above-mentioned compound (B1) may include, for example, succinimide, N-methylsuccinimide, α,α-dimethyl-β-methylsuccinimide,α-methyl-α-propylsuccinimide, meleimide, N-methylmaleimide, N-ethylmaleimide, N-propylmaleimide, N-tert-butylmaleimide, N-laurylmaleimide, N-cyclohexylmaleimide, N-phenylmaleimide, N-(2-chlorophenyl)maleimide, N-benzylmaleimide, N-(1-pyrenyl)maleimide, 3-methyl-N-phenylmaleimide, N,N'-1,2-phenylenedimaleimide, N,N'-1,3-phenylenedimaleimide, N,N'-1,4-phenylenedimaleimide, N,N'-(4-methyl-1,3-phenylene)bismaleimide, 1,1'-(methylene-1,4-diphenylene)bismaleimide, phthalimide, N-methylphthalimide, N-ethylphthalimide, N-propylphthalimide, N-phenylphthalimide, N-benzylphthalimide, pyromellitic acid diimide; copolymers of N-alkylmaleimides and compounds having radical polymerizable double bonds; copolymers of N-alkylmaleimides and (meth)acrylates; copolymers of N-alkylmaleimides and styrene; and copolymers of N-alkylmaleimides and vinyl ethers.

When Y is phosphorus, the above-mentioned compound (B1) may include, for example, acylphosphine oxides such as bis(2,6-dimethoxybenzoyl)-2,4,4-trimethyl-pentylphosphine oxide, bis(2,4,6-trimethylbenzoyl)-phenylphosphine oxide, and the like.

When Y is carbon, the above-mentioned compound (B1) may include, for example, diketones such as 2,4-pentadione, 3-methyl-2,4-pentadione, 3-ethyl-2,4-pentadione, 3-chloro-2,4-pentadione, 1,1,1-trifluoro-2,4-pentadione, 1,1,1,5,5,5-hexafluoro-2,4-pentadione, 2,2,6,6-tetramethyl-3,5-heptanedione, 1-benzoylacetone, dibenzoylmethane and the like; polycarboxylic acid esters such as dimethyl malonate, diethyl malonate, dimethyl methylmalonate, tetraethyl 1,1,2,2-ethanetetracarboxylic acid and the like; α-carbonylacetic acid esters such as methylacetyl acetonate, ethylacetyl acetonate, methylpropionyl acetate and the like; 3-phenyl-2,4-pentanedione, 3-benzyl-2,4-pentanedione, diethylbenzyl malonate, diethylallyl malonate, diethyl diallylmalonate, diethyl ethylidenemalonate, triacetylmethane, triethyl methanetricarboxylate and the like.

Above all, as the above-mentioned compound (B1), since carboxylic anhydrides, carboxylic acid imides, or acylphosphine oxides are capable of promoting photo-polymerization or crosslinking reaction at a high rate for the hydrolyzable metal compound (A) and excellent in solubility in the polymers obtained by polymerization of the hydrolyzable metal compound (A), they are preferable to be used.

The mixing ratio of the above-mentioned compound (B) to 100 parts by weight of the hydrolyzable metal compound (A) is preferably 0.01 to 30 parts by weight. When it is less than 0.01 parts by weight, it sometimes becomes difficult to give sufficient reactivity to the hydrolyzable metal compound (A) and when it exceeds 30 parts by weight, the light transmission of a photoreactive composition to be obtained is significantly decreased, so that polymerization or crosslinking takes place only in the surface where light is irirradiated and therefore, the reactivity in the deep part is sometimes significantly decreased. It is further preferably 0.1 to 20 parts by weight.

In order to improve the photoreactivity, that is, in order to shorten the light irradiation duration and lower the irradiation energy of light or in order to cause polymerization and crosslinking deeper and faster in the composition, a photoradical generating agent (C) may be added.

The above-mentioned radical generating agent (C) includes compounds which are decomposed to be radical by light rays such as UV rays, visible rays, and the like; compounds which generate radical by hydrogen pull reaction; compounds which generate radical by energy transfer owing to such as electron transfer. Preferably, compounds having polymerization initiating function to acrylic acid esters and methacrylic acid esters can be exemplified. A plurality of types of such compounds may be used as the photoradical generating agent (C).

The above-mentioned photoradical generating agent (C) may include, for example, 4-(2-hydroxyethoxy)phenyl (2-hydroxy-2-propyl) ketone; acetophenone derivatives such as α-hydroxy-α,α'-dimethylacetophenone, methoxyacetophenone, 2,2-dimethoxy-2-phenylacetophenone and the like; benzoin ether type compounds such as benzoin ethyl ether, benzoin propyl ether, and the like; halogenated ketones; acyiphosphine oxides; acylphosphonates; 2-methyl-1-[4-(methylthio)phenyl]-2-morpholinopropan-1-one, 2-benzyl-2-N,N-dimethylamino-1-(4-morpholinophenyl)-1-butanone; bis(2,4,6-trimethylbenzoyl)-phenylphosphine oxide; bis-(2,6-dimethoxybenzoyl)-2,4,4-trimethylpentylphosphine oxide; bis(η5-cyclopentadienyl)-bis(pentafluorophenyl)titanium, bis(η5-cyclopentadienyl)-bis[2,6-difluoro-3-(1H-pyrid-1-yl) phenyl]titanium; anthracene, perylene, coronene, tetracene, benzanthracene, phenothiazine, flavin, acridine, ketocoumarin, thioxanthone derivatives, benzophenone, acetophenone, 2-chlorothioxanthone, 2,4-dimethylthioxanthone, 2,4-diethylthioxanthone, 2,4-diisopropylthioxanthone, isopropylthioxanthone and the like.

Commercialized photoradical polymerization initiators may be used also as the photoradical generating agent. Further, since diacylphosphine compounds are photoradical generating agents decomposed to be radical by irradiation of light and including the radical after decomposition, they have a molecular skeleton represented by the above-mentioned general formula (1-2), they are those which can be satisfactory as the compound (B) and the photoradical generating agent (C) and therefore preferable.

The mixing amount of the above-mentioned photoradical generating agent (C) to 100 parts by weight in the total of the compound (A) and the compound (B) is preferably 0.001 to 10 parts by weight. When it is less than 0.001 parts by weight, it is sometimes difficult for the photoradical generating agent (C) to give sufficient reactivity to the photoreactivity and when it exceeds 10 parts by weight, the light transmission of a photoreactive composition of the present invention is significantly decreased, so that polymerization or crosslinking takes place only in the surface where light is irirradiated and therefore, polymerization or crosslinking does not take place in the deep part significantly.

Incidentally, in the case where the photoradical generating agent (C) is a diacylphosphine compound, it is preferably 0.001 to 10 parts by weight to 100 parts by weight of the compound (A). It is furthermore preferably 0.01 to 5 parts by weight.

In order to improve the photoreactivity or post-curing property after irradiation of light, a hydrogen radical supplying agent (D) may be added to a photoreactive substance of the present invention.

Any compounds from which hydrogen radical can be easily pulled may be used as the above-mentioned hydrogen radical supplying agent (D) and for example, compounds such as mercaptans and alkylbenzenes showing chain transferring property in free radical polymerization can be exemplified. A plurality of types of the compounds may be used in combination for the above-mentioned hydrogen radical supplying agent (D).

The above-mentioned hydrogen radical supplying agent (D) may include, for example, thiols such as n-butylmercaptan, laurylmercaptan, cyclehexylmercaptan, 1,6-hexanedithiol and the like; sulfides such as di-n-butyldisulfide, di-n-butylsulfide, tetrahydrothiophene, pentamethylene sulfide, 1,4-dithiane, diphenylsulfide and the like; compounds having hydrogen in aryl group such as toluene, xylene, mesitylene, isopropylbenzene, ethylbenzene, benzyl methyl ether and the like; amines such as triethylamine, butylamine, aniline, methylaniline, di(p-aminophenyl)methane and the like; alkyl halides such as n-butyl iodide, n-butyl bromide, n-butyl chloride, 2-chlorobutane, chloroform and the like; ethers such as dimethyl ether, diethyl ether, diisopropyl ether, tetrahydrofuran, 1,4-dioxane, anisole, diphenyl ether and the like; alcohols such as methanol, ethanol, propyl alcohol, isopropyl alcohol, n-butyl alcohol, cyclohexyl alcohol, cyclohexanedimethanol, polyethyleneglycol, polypropyleneglycol, glycerin and the like; carboxylic acids such as acetic acid, propionic acid, butyric acid, cyclohexane-1,4-dicarboxylic acid, benzoic acid, phthalic acid and the like; ketones such as acetone, methyl ethyl ketone, acetylbenzene, diacetylbenzene and the like; and hydrocarbons such as hexane, heptane, cyclehexane, tert-butylbenzene and the like.

The mixing amount of the above-mentioned hydrogen radical supplying agent (D) to 100 parts by weight in the total of the compound (A) and the compound (B) is preferably 0.1 to 20 parts by weight. When it is less than 0.1 parts by weight, it is sometimes difficult to give quick post-curing property and when it exceeds 20 parts by weight, sufficient coagulating force cannot be obtained in some cases at the time of obtaining a cured body.

The photoreactive composition of the present invention may further contain an orgnometal compound (E) which promotes hydrolysis and condensation reaction of the hydrolyzable metal compound (A).

With respect to the photoreactive composition of the present invention, for example, in the case where the composition is stored in an air-tight container or consumed completely in a short time after opening or in the case a coating apparatus in which the countermeasure for shutting moisture for storage or supply of an adhesive is employed, a non-irradiation of light part is contingently or inevitably generated. In such a case, the organometal compound (E) is added, therefore, polymerization or crosslinking reaction of the hydrolyzable metal compound (A) after irradiation of light can be promoted. Further, curing can be carried out even in the non-irradiation of light part.

The above-mentioned organometal compound (E) may include, for example, organometal compounds comprising of metal elements such as germanium, tin, lead, boron, aluminum, gallium, indium, titanium, zirconium and the like for substituting organic groups and further practical examples of the compound are tin compounds such as dibutyltin dilaurate, dibutyltin oxide, dibutyltin diacetate, dibutyltin phthalate, bis(dibutyltin laurylic acid) oxide, dibutyltin bisacetylacetonate, dibutyltin bis(monoestermaleate), tin octylate, dibutyltin octoate, dioctyltin oxide and the like; titanate type compounds such as tetra-n-butoxytitanate, tetraisopropoxy titanate and the like. They may be used alone or in combination with two or more of them.

The mixing amount of the above-mentioned organometal compound (E) to 100 parts by weight of the compound (A) is preferably 0.01 to 10 parts by weight. When it is less than 0.01 parts by weight, the reaction promotion of the compound (A) after irradiation of light cannot be expected and when it exceeds 10 parts by weight, although the reaction after irradiation of light can be promoted, the considerable effect on the reaction product tends to be caused. It is furthermore preferably 0.1 to 8 parts by weight.

The photoreactive composition of the present invention may further-contain a compound having a polymerizable group (F). In a specified combination of the above-mentioned hydrolyzable metal compound (A) and the above-mentioned compound (B), a polymer or a crosslinked body is sometimes produced after a while from the irradiation of light and a desired coagulating force cannot be obtained immediately after the irradiation of light and therefore, utilization immediately after the irradiation of light is restricted. Addition of the above-mentioned compound (F) can improve the coagulating force immediately after the irradiation of light.

As the polymerizable group of the above-mentioned compound (F) is preferably a radical polymerizable unsaturated group or a cationic polymerizable group.

The above-mentioned radical polymerizable unsaturated group may include, for example, vinyl, allyl, isopropenyl, styryl, vinyloxy, vinyloxycarbonyl, acryloyl, methacryloyl, vinylcarbonyl, N-vinylamino group and the like. Among them, methacryloyl or acryloyl group is preferably. A plurality of the radical polymerizable groups may be used in combination.

The above-mentioned compound having a styryl group may include, for example, styrene, indene, α-methylstyrene, p-methylstyrene, p-chlorostyrene, p-chloromethylstyrene, p-methoxystyrene, p-tert-butoxystyrene, divinylbenzene and the like.

The above-mentioned compound having an acryloyl or methacryloyl group may include, for example, methyl (meth)acrylate, ethyl (meth)acrylate, propyl (meth)acrylate, n-butyl (meth)acrylate, tert-butyl (meth)acrylate, cyclohexyl (meth)acrylate, 2-ethylhexyl (meth)acrylate, n-octyl (meth)acrylate, isooctyl (meth)acrylate, isononyl (meth)acrylate, isomyristyl (meth)acrylate, stearyl (meth)acrylate, isobornyl (meth)acrylate, benzyl (meth)acrylate, 2-butoxyethyl (meth)acrylate, 2-phenoxyethyl (meth)acrylate, glycidyl (meth)acrylate, tetrahydrofurfuryl (meth)acrylate, hexanediol di(meth)acrylate, ethyleneglycol di(meth)acrylate, polyethyleneglycol di(meth)acrylate, propyleneglycol di(meth)acrylate, polypropylene di(meth)acrylate, neopentylglycol di(meth)acrylate, trimethylolpropane tri(meth)acrylate, pentaerythritol di(meth)acrylate, pentaerythritol tri(meth)acrylate, pentaerythritol tetra(meth)acrylate, dipentaerythritol hexa(meth)acrylate, epoxy acrylate, polyester acrylate, urethane acrylate, 2-hydroxyethyl (meth)acrylate, 3-hydroxypropyl (meth)acrylate, 2-hydroxypropyl (meth)acrylate, 4-hydroxybutyl (meth)acrylate, 2-hydroxybutyl (meth)acrylate, 5-hydroxypentyl (meth)acrylate, 6-hydroxyhexyl (meth)acrylate, 3-hydroxy-3-methylbutyl (meth)acrylate, 2-hydroxy-3-phenoxypropyl (meth)acrylate, pentaerythritol tri(meth)acrylate, 2-[(meth)acryloyloxy]ethyl-2-hydroxyethylphthalic acid, 2-[(meth)acryloyloxy]ethyl-2-hydroxypropylphthalic acid, and compounds represented by the following general formulas (3), (4), (5), (6), (7), (8), (9), (10), (11), (12), (13), (14), (15), (16), (17), (18), (19), (20), (21) and (22):

$$CH_2=CH-C(O)O-CH_2CH_2O-[C(O)CH_2CH_2CH_2CH_2CH_2O]_n-H \quad (3)$$

(n=1~10)

$$CH_2=C(CH_3)-C(O)O-CH_2CH_2O-[C(O)CH_2CH_2CH_2CH_2CH_2O]_n-H \quad (4)$$

(n=1~10)

$$CH_2=CH-C(O)O-(CH_2CH_2O)_n-H \quad (5)$$

(n=1~12)

$$CH_2=C(CH_3)-C(O)O-(CH_2CH_2O)_n-H \quad (6)$$

(n=1~12)

$$CH_2=CH-C(O)O-[CH_2CH(CH_3)O]_n-H \quad (7)$$

(n=1~12)

$$CH_2=C(CH_3)-C(O)O-[CH_2CH(CH_3)O]_n-H \quad (8)$$

(n=1~12)

$$CH_2=C(CH_3)-C(O)O-(CH_2CH_2O)_n-[CH_2CH(CH_3)O]_m-H \quad (9)$$

(n=1~12)

$$CH_2=CH-C(O)O-(CH_2CH_2O)_n-[CH_2CH(CH_3)O]_m-H \quad (10)$$

(n=1~12)

$$CH_2=C(CH_2)-C(O)O-(CH_2CH_2O)_n-(CH_2CH_2CH_2CH_2O)_mH \quad (11)$$

(n=1~12)

$$CH_2=CH-C(O)O-(CH_2CH_2O)_n-(CH_2CH_2CH_2CH_2O)_mH \quad (12)$$

(n=1~12)

$$CH_2=CH-C(O)O-(CH_2CH_2O)_n-CH_3 \quad (13)$$

(n=1~10)

$$CH_2=C(CH_3)-C(O)O-(CH_2CH_2O)_n-CH_3 \quad (14)$$

(n=1~30)

$$CH_2=CH-C(O)O-[CH_2CH(CH_3)O]_n-CH_3 \quad (15)$$

(n=1~10)

$$CH_2=C(CH_3)-C(O)O-ECH_2CH(CH_3)O]_n-CH_3 \quad (16)$$

(n=1~10)

$$CH_2=C(CH_3)-C(O)O-(CH_2CH_2O)_n-[CH_2CH(CH_3)O]_m-H \quad (17)$$

(n=1~10)

$$CH_2=CH-C(O)O-(CH_2CH_2O)_n-[CH_2CH(CH_3)O]_m-H \quad (18)$$

(n=1~10)

$$CH_2=CH-C(O)O-[CH_2CH(CH_3)O]_n-C(O)-CH=CH_2 \quad (19)$$

(n=1~20)

$$CH_2=C(CH_3)-C(O)O-[CH_2CH(CH_3)O]_n-C(O)-C(CH_3)=CH_2 \quad (20)$$

(n=1~20)

$$CH_2=CH-C(O)O-[CH_2CH_2O]_n-C(O)-CH=CH_2 \quad (21)$$

(n=1~20)

$$CH_2=C(CH_3)-C(O)O-[CH_2CH_2O]_n-C(O)-C(CH_3)=CH_2 \quad (22)$$

(n=1~20)

The above-mentioned compound having a vinyl ester group may include, for example, vinyl acetate, vinyl propionate, vinyl butyrate, vinyl capronate, vinyl benzoate, vinyl cinnamate, and the like.

The above-mentioned compound having a vinyloxy group may include, for example, n-propyl vinyl ether, n-butyl vinyl ether, isobutyl vinyl ether, tert-butyl vinyl ether, tert-amyl vinyl ether, cyclohexyl vinyl ether, 2-ethylhexyl vinyl ether, dodecyl vinyl ether, octadecyl vinyl ether, 2-chloroethyl vinyl ether, ethyleneglycolbutyl vinyl ether, triethyleneglycolmethyl vinyl ether, (4-vinyloxy)butyl benzoate, ethyleneglycol divinyl ether, diethyleneglycol divinyl ether, triethyleneglycol divinyl ether, tetraethyleneglycol divinyl ether, butane-1,4-diol divinyl ether, hexane-1,6-diol divinyl ether, cyclohexane-1,4-dimethanol divinyl ether, di(4-vinyloxy)butyl isophthalate, di(4-vinyloxy)butyl glutarate, di(4-vinyloxy)butyl succinate trimethylolpropane trivinyl ether, 2-hydroxyethyl vinyl ether, 4-hydroxybutyl vinyl ether, 6-hydroxyhexyl vinyl ether, cyclohexane-1,4-dimethanol monovinyl ether, diethylene glycol monovinyl ether-3-aminopropyl vinyl ether, 2-(N,N-diethylamino)ethyl vinyl ether, urethane vinyl ether, polyester vinyl ether and the like.

The above-mentioned cationic polymerizable group is a functional group which causes chain reaction of polymerization and crosslinking in the presence of an acid such as a protonic acid or Lewis acid. As such a functional group, for example, an epoxy, oxetanyl, styryl, vinyloxy group and the like can be exemplified. Compounds comprising a plurality of cationic polymerizable groups in combination in one molecule may be also usable.

The above-mentioned compound having a styryl group may include, for example, styrene, indene, α-methylstyrene, p-methylstyrene, p-chlorostyrene, p-chloromethylstyrene, p-methoxystyrene, p-tert-butoxystyrene, divinylbenzene and the like.

The above-mentioned compound having an epoxy group may include, for example, bisphenol A type epoxy resin, hydrogenated bisphenol A type epoxy resin, bisphenol F type epoxy resin, novolak type epoxy resin, cresol type epoxy resin, alicyclic type epoxy resin, epoxy resin bromide, rubber-modified epoxy resin, urethane-modified epoxy resin, glycidyl ester type compounds, epoxylated polybutadiene, epoxylated SBS and the like. Incidentally, SBS means (styrene-co-butadiene-co-styrene) copolymers.

The above-mentioned compound having oxetanyl group may include, for example, 3-ethyl-3-hydroxymethyloxetane, 3-ethyl-3-phenoxymethyloxetane, 3-ethyl-3-hexyloxymethyloxetane, 1,4-bis[(3-ethyl-3-oxetanylmethoxy)methyl]benzene and the like.

The above-mentioned compound having vinyloxy group may include, for example, n-propyl vinyl ether, n-butyl vinyl ether, isobutyl vinyl ether, tert-butyl vinyl ether, tert-amyl vinyl ether, cyclohexyl vinyl ether, 2-ethylhexyl vinyl ether, dodecyl vinyl ether, octadecyl vinyl ether, 2-chloroethyl vinyl ether, ethyleneglycolbutyl vinyl ether, triethyleneglycolmethyl vinyl ether, (4-vinyloxy)butyl benzoate, ethyleneglycol divinyl ether, diethyleneglycol divinyl ether, triethyleneglycol divinyl ether, tetraethyleneglycol divinyl ether, butane-1,4-diol divinyl ether, hexane-1,6-diol divinyl ether, cyclohexane-1,4-dimethanol divinyl ether, di(4-vinyloxy)butyl isophthalate, di(4-vinyloxy)butyl glutarate, di(4-vinyloxy)butyl succinate trimethylolpropane trivinyl ether, 2-hydroxyethyl vinyl ether, 4-hydroxybutyl vinyl ether, 6-hydroxyhexyl vinyl ether, cyclohexane-1,4-dimethanol monovinyl ether, diethylene glycol monovinyl ether, 3-aminopropyl vinyl ether, 2-(N,N-diethylamino)ethyl vinyl ether, urethane vinyl ether, polyester vinyl ether and the like.

In the case the above-mentioned compound having a cationic polymerizable group is selected as the above-mentioned compound (F), the above-mentioned compound (F) may have a functional group represented by the above-mentioned general formula (2-2). That is, the compound may be those having the cationic polymerizable group and a functional group represented by the above-mentioned general formula (2-2) or those having a plurality of and a plurality of types of the cationic polymerizable groups and functional groups represented by the above-mentioned general formula (2-2) in combination. Examples of such compound (F) are trimethoxy[2-(7-oxabicyclo[4,1,0]-hepto-3-yl)ethyl]silane, 3-glycidoxypropyltrimethoxysilane, 3-glycidoxypropylmethyldiethoxysilane, 3-glycidoxypropyldimethylethoxysilane, 3-glycidoxypropyldiisopropylethoxysilane, 3-glycidoxypropylmethyldiisopropenoxysilane, styrylethyltrimethoxysilane, 3-(3-tetraethoxysilylpropoxy)methyl-3-ethyloxetane and the like. They may be used alone or in combination of two or more of them.

In the case the above-mentioned compound having a cationic polymerizable group is selected as the above-mentioned compound (F), the photoreactive composition of the present invention is preferable to contain a compound which polymerizes or crosslinks the compound (F) having a cationic polymerizable group.

Examples of such a compound are iron-allene complex compounds, aromatic diazonium salts, aromatic iodonium salts, aromatic sulfonium salts, pyridinium, aluminum complex/silanol salts, haloalkyl-substituted triazine derivatives, trifluoromethanesulfonic acid-N-imide ester derivatives, benzenesulfonic acid-N-imide ester derivatives, methanesulfonic acid-N-imide ester derivatives, tribromomethylphenylsulfone derivatives and the like. Among these compounds, those commercialized are, for example, Irgacure 261 (produced by Ciba-Geigy Corp.), Optomer SP-150 (produced by Asahi Denka Kogyo K.K.), Optomer SP-151 (produced by Asahi Denka Kogyo K.K.), Optomer SP-170 (produced by Asahi Denka Kogyo K.K.), Optomer SP-171 (produced by Asahi Denka Kogyo K.K.), UVE-1014 (produced by General Electr. Co.,), CD-1012 (produced by Sartomer Company.), San-Aid SI-60L (produced by Sanshin Chemical Industry Co., Ltd.), San-Aid SI-80L (produced by Sanshin Chemical Industry Co., Ltd.), San-Aid SI-100L (produced by Sanshin Chemical Industry Co., Ltd.), CI-2064 (produced by Nippon Soda Co., Ltd.), CI-2639 (produced by Nippon Soda Co., Ltd.), CI-2624 (produced by Nippon Soda Co., Ltd.), CI-2481 (produced by Nippon Soda Co., Ltd.), RHODORSIL PHOTOINITIATOR 2074 (produced by Rhone-Poulenc Ltd.), UVI-6990 (produced by Union Carbide Corp.), BBI-103 (produced by Midori Kagaku Co., Ltd.), MPI-103 (produced by Midori Kagaku Co., Ltd.), TPS-103 (produced by Midori Kagaku Co., Ltd.), MDS-103 (produced by Midori Kagaku Co., Ltd.), DTS-103 (produced by Midori Kagaku Co., Ltd.), NAT-103 (produced by Midori Kagaku Co., Ltd.), NDS-103 (produced by Midori Kagaku Co., Ltd.) and the like. They may be used alone or in combination of two or more of them.

The addition amount of the above-mentioned compound which polymerizes or crosslinks the compound (F) having a cationic polymerizable group by irradiation of light is preferably 0.01 to 30 parts by weight to 100 parts by weight of the compound (F). When it is less than 0.01 parts by weight, it sometimes becomes difficult to obtain sufficient photoreactivity and when it exceeds 30 parts by weight, the light transmission of a photoreactive composition to be obtained is significantly decreased, so that polymerization or crosslinking takes place only in the surface where light is irirradiated and therefore, the reactivity in the deep part is sometimes significantly decreased. It is further preferably 0.1 to 20 parts by weight.

The addition amount of the compound (F) to 10 to 99 parts by weight of the hydrolyzable metal compound is preferably 1 to 90 parts by weight. When it is less than 1 part by weight, it sometimes becomes difficult to obtain sufficient coagulating force and when it exceeds 90 parts by weight, the sufficient strength of a cured product cannot be obtained.

In the case the photoreactive composition of the present invention contains the compound (F), in order to leave no unreacted compound (F) owing to contingent or inevitable generation of a non-irradiation of light part at the time of use of the photoreactive composition of the present invention, a polymerization initiator of the compound (F) is preferably added further. As the polymerization initiator of the above-mentioned compound (F), when the compound (F) has a radical polymerizable unsaturated group, a thermoradical generating agent or a radical generating agent which generates radical by being heated under anaerobic conditions can be exemplified. Further, when the compound (F) has a cationic polymerizable group, compounds which polymerize the cationic polymerizable group by thermal activity can be exemplified and examples of them are onium salts such as sulfonium salts, iodonium salts, ammonium salts and the like; and Lewis acid-Lewis base complexes such as trifluoroboron trimethylamine complex, trifluoroboron pyridine complex and the like. Further, when the compound (D) is one having an epoxy group, compounds generating amines by heat or moisture such as dicyanodiamide, ketimine and the like can be exemplified.

The above-mentioned thermoradical generating agent may include, for example, organic peroxides, that is, hydroperoxides such as diisopropylbenzene hydroperoxide, 1,1,3,3-tetramethylbutyl hydroperoxide, cumene hydroperoxide, tert-hexyl hydroperoxide, tert-butyl hydroperoxide and the like; dialkyl hydroperoxides such as α,α'-bis(tert-butylperoxy-m-isopropyl)benzene, dicumyl peroxide, 2,5-dimethyl-2,5-bis(tert-butylperoxy)hexane, tert-butyl cumyl peroxide, di-tertbutyl peroxide, 2,5-dimethyl-2,5-bis(tert-butylperoxy)hexene-3 and the like; ketone peroxides; peroxyketals; diacyl peroxides; peroxydicarbonates; peroxyesters; and azone compounds such as 2,2'-azobisisobutyronitrile, 1,1'-(cyclohexane-1-carbonitrile), 2,2'-azobis(2-cyclopropylpropionitrile), 2,2'-azobis(2,4-dimethylvaleronitrile) and the like. They may be used alone or in combination of two or more of them.

As the above-mentioned radical generating agent which generates radical by being heated under anaerobic conditions, combinations (mixtures) of organic peroxides/quinone compounds such as benzoquinone/cumene hydroperoxide can be exemplified.

The photoreactive composition of the present invention may further contain a compound (G) having an epoxy group. Addition of the foregoing compound (G) having an epoxy group further improves the adhesion strength and sticking property of the photoreactive composition of the present invention.

The above-mentioned compound (G) may include, for example, bisphenol A type epoxy resins, phenol novolak type epoxy resins, alicyclic epoxy resins, polyglycidylamine type epoxy resins, aliphatic epoxy resins, epoxysilane compounds and the like. Those having especially significant effect among them are epoxy compounds having functional groups represented by the above-mentioned general formula (2-2) and compounds having three or more epoxy groups each in one molecule. They may be used alone or in combination of two or more of them.

The epoxy compounds having functional groups represented by the above-mentioned general formula (2-2) may include, for example, γ-glycidoxypropyltrimethoxysilane, γ-glycidoxypropylmethyldimethoxysilane, γ-glycidoxypropylmethyldiethoxysilane, γ-glycidoxypropyltriethoxysilane, β-(3,4-epoxycyclohexyl)ethyltrimethoxysilane, β-(3,4-epoxycyclohexyl)ethylmethyldimethoxysilane, β-(3,4-epoxycyclohexyl)ethyltriethoxysilane, β-(3,4-epoxycyclohexyl)ethylmethyldiethoxysilane and the like.

Among these compounds having three or more epoxy groups each in one molecule, those commercialized are, for example, trade name Epikote 152, Epikote 154, and Epikote 604 produced by Japan Epoxy Resin; Epoleed GT 301, Epoleed GT 302, Epoleed GT 401, and Epoleed GT 403 produced by Daicel Chem. Ind., Ltd.; and the like.

The addition amount of the above-mentioned compound (G) to 100 parts by weight of the resin component of the photoreactive composition of the present invention is preferably 0.1 to 30 parts by weight. When it is less than 0.1 parts by weight, no sufficient effect of the compound (G) can be obtained and when it exceeds 30 parts by weight, although the adhesion strength to a metal is improved, the effect as a whole becomes too significant in some case.

For the purpose to adjust the polymerization or crosslinking degree and the physical properties of a reaction product, the photoreactive composition of the present invention may further contain a compound which generates one silanol group in one molecule by hydrolysis or a compound which has one silanol group in one molecule.

The above-mentioned compound which generates one silanol group in one molecule by hydrolysis may be those which generate compounds having one bond between one silicon and hydroxyl in each one molecule by hydrolysis and examples of the compound are trialkylmonoalkoxysilane such as methoxytrimethylsilane, ethoxytrimethylsilane, methoxytriethylsilane, ethoxytriethylsilane, propoxytrimethylsilane and the like; trialkylsilyl ester such as trimethylsilyl acetate and the like; trialkylsilylamine such as N,N-bistrimethylsilylamine, trimethyl-N,N-dimethylaminosilane and the like; N,N'-bistrimethylsilylurea; N-trimethylsilylimidazole and the like.

The above-mentioned compound which has one silanol group in one molecule may be those which have one bond between one silicon and hydroxyl in each one molecule and examples of them are trialkylsilanol such as trimethylsilanol, triethylsilanol, tripropylsilanol, triisopropylsilanol, tri-n-butylsilanol, tri-tert-butylsilanol, tri-sec-butylsilanol and the like; triphenylsilanol, diphenylmethylsilanol, phenyldimethylsilanol, diphenylethylsilanol, phenyldiethylsilanol, benzyldiethylsilanol, α-naphthyldimethylsilanol, β-naphthyldimethylsilanol, polysiloxane or cyclic siloxane-derived compounds having silicon bonded each with one hydroxyl group; polysilane having one hydroxyl group at terminal. These compounds may be used alone or in combination of two or more of them.

The addition amount of the compound which generates one silanol group in one molecule by hydrolysis or the compound which has one silanol group in one molecule is not particularly limited, however it is preferably 0.001 to 500 parts by weight to 100 parts by weight in total of the above-mentioned hydrolyzable metal compound (A) and the compound (B). When it is less than 0.001 parts by weight, the adjustment effect cannot be obtained in some cases and when it exceeds 500 parts by weight, the crosslinking of Si—X contained in the hydrolyzable metal compound (A) tends to be difficult to be caused, so that in the case of use as an adhesive, sufficiently crosslinked body or polymer cannot be obtained in some cases.

The photoreactive composition of the present invention is preferable to further contain oxygen. As described above, polymerization or crosslinking reaction of the above-mentioned hydrolyzable metal compound (A) using the above-mentioned compound (B) can be promoted by oxygen.

The photoreactive composition of the present invention may contain a variety of additives having known functions such as a photosensitive sensitizer for adapting the above-mentioned compound (B) or a photoradical generating agent (C), a thickener, a thixotropic agent for adjusting the viscosity property of the composition, a physical property adjustment agent for improving the tensile strength or the like, an extender, a reinforcing agent, a plasticizer, a coloring agent, a flame retarder and the like, based on the necessity.

The thickener is selected, for example, from polymer compounds with good compatibility with the compound (A) and properly used depending on the compounds to be added to the composition. Examples of the polymer compounds may include acrylic polymers, methacrylic polymers, polyvinyl alcohol derivatives, polyvinyl acetate, polystyrene derivatives, polyesters, polyethers, polyisobutene, polyolefins, polyalkylene oxides, polyurethanes, polyamides, natural rubber, polybutadiene, polyisoprene, NBR, SBS, SIS, SEBS, hydrogenated NBR, hydrogenated SBS, hydrogenated SIS, hydrogenated SEBS and the like; their copolymers, functional group-modified bodies and the like. They may be used alone or in combination of two or more of them.

As the above-mentioned thixotropic agent, substances with compositions proper to give thixotropy are properly selected. For example, colloidal silica, polyvinyl pyrrolidone, hydrophobic calcium carbonate, glass balloon, glass beads and the like can be exemplified. It is preferable to select those having surface with high affinity to the compound (A).

The above-mentioned physical property adjustment agent for improving the tensile strength or the like may include, for example, a variety of silane coupling agents such as vinyltrimethoxysilane, dimethyldimethoxysilane, methyltrimethoxysilane, methyltriethoxysilane, tetramethoxysilane, tetraethoxysilane, phenyltrimethoxysilane, diphenyldimethoxysilane, 3-aminopropyltrimethoxysilane, 3-aminopropylmethyldimethoxysilane, 3-aminopropyltriethoxysilane, N-(2-aminoethyl)-3-aminopropyltrimethoxysilane, N-(2-aminoethyl)-3-aminopropyltriethoxysilane, N,N'-bis[3-(trimethoxysilyl)propyl]ethylenediamine, N,N'-bis[3-(triethoxysilyl)propyl]ethylenediamine, N,N'-bis[3-(trimethoxysilyl)propyl]hexaethylenediamine, N,N'-bis[3-(triethoxysilyl)propyl]hexaethylenediamine and the like. They may be used alone or in combination of two or more of them.

As the above-mentioned extender, those which do not show thixotropy when added to the photoreactive composition of the present invention can be used preferably and examples are talc, clay, calcium carbonate, magnesium carbonate, dehydrated silica, hydrated silica, calcium silicate, titanium dioxide, carbon black and the like. They may be used alone or in combination of two or more of them.

As the above-mentioned plasticizer, for example, phosphoric acid esters such as tributyl phosphate, tricresyl phosphate and the like; phthalic acid esters such as dioctyl phthalate and the like; aliphatic acid-basic acid esters such as glycerin monooleate and the like; aliphatic acid dibasic acid esters such as dioctyl adipate and the like; and polypropylene glycols. They may be used alone or in combination of two or more of them.

Besides, based on the necessity, a dripping preventing agent, an antioxidant, an aging preventing agent, a UV absorbent, a solvent, a fragrance, a pigment, a dye and the like may be added.

A light source to be employed for irradiating light to the photoreactive composition of the present invention is not particularly limited when the light source is capable of emitting present light rays by which the photoreactive composition of the invention shows photoreactivity to give a polymer or a crosslinked body by photoreaction of the compound (A). The light source may be properly selected depending on the purposes.

Preferable examples of such light source are those emitting light including light rays with absorption wavelength of the composition of the present invention attributed to the above-mentioned compound (B). Further, with respect to the photoreactive composition of the present invention containing a photoradical generating agent (C), light sources capable of emitting light including light rays with absorption wavelength of the composition of the present invention attributed to both of the compound (B) and the compound (C) are preferable.

In the case a plurality of light sources are employed in combination as such a light source, it is preferable to simultaneously radiate light rays from the various light sources to the composition. Further, the light rays may be successively irirradiated from the respective light sources or reciprocally irirradiated from the respective light sources.

As a known light source, for example, a low pressure mercury lamp, a middle pressure mercury lamp, a high pressure mercury lamp, an ultrahigh pressure mercury lamp, an excimer laser, a chemical lamp, a black light lamp, a microwave-excited mercury lamp, a metal halide lamp, a sodium lamp, a halogen lamp, a xenone lamp, a fluorescent lamp, sunrays, and an electron beam irradiation apparatus and the like can be exemplified. Further, a filter may be used for decrease or remove unnecessary wavelength or a variety of light sources may be used in combination. The irradiation of a variety of the light sources to the composition of the present invention may be simultaneous irradiation from a variety of light sources or successive irradiation with time intervals or the simultaneous irradiation and the successive irradiation may be combined.

In the case the photoreactive composition of the present invention is cured, a gas containing oxygen gas is preferable to be brought into contact with the composition. As described above, polymerization or crosslinking reaction of the above-mentioned hydrolyzable metal compound (A) by using the above-mentioned compound (B) is promoted by the existence of oxygen.

A curing method of the photoreactive composition of the present invention involving a step of bringing a gas containing oxygen gas into contact with the photoreactive composition to which light is irirradiated for curing the photoreactive composition is also one embodiment of the present invention.

The photoreactive composition of the present invention can be used for a painting material, an ink, a coating material, a surface protection material, a seal material, a surface treatment agent, a potting material, a master plate material, a resist material, a forming material, a photo-forming material, a photo-thickener and the like other than the photo-post-curing composition, the adhesive composition, and the sealing composition.

In the case the photoreactive composition of the present invention is applied, for example, to an object to be coated inferior in the light transmission, even if light is irradiated to the object after application or packing, it is sometimes difficult to cause photo-reaction and even in such a case, the photoreactive composition of the present invention has a post-curable property that the polymerization reaction or gelling reaction of the composition is sustainably promoted even after the irradiation of light and thus the photoreactive composition of the present invention can be used as a photo-post-curing composition. Accordingly, based on such a property, in the case of application to an object inferior in the light transmission, a photo-post-curing composition, which is the photoreactive composition of the present invention, can be used by irradiating light to the composition and then applying or packing it in an object to be coated.

Further, the photoreactive composition of the present invention can be preferably used for an adhesive composition or a sealing composition. That is, in the case of application as the adhesive composition, when either one members to be joined to each other is excellent in transmission of light rays to which the photoreactive composition of the present invention is photosensitive, the photoreactive composition of the present invention is applied to one member and then the other member is stuck thereto. After that, light rays are irradiated from the member excellent in the light transmission to improve the coagulating force of the composition of the present invention and the adhesion force to obtain a joined body and in such a manner the composition can be used as an adhesive.

Further, in the case both of the members to be joined to each other are inferior in transmission to at least light rays to which the photoreactive composition of the present invention is photosensitive or in the case they are deteriorated by light rays to which the photoreactive composition of the present invention is photosensitive, an adhesive composition containing the photoreactive composition of the present invention is applied to one of the members to be joined and light is irradiated to the top face of the composition layer on the coated member and then the other member to be joined is stuck thereon or after irradiation of light, the adhesive composition containing the photoreactive composition of the present invention is applied to members to be joined to each other and then the members are stuck to each other.

In the case a sealing composition containing the photoreactive composition of the present invention is used, the sealing composition containing the photoreactive composition of the present invention is packed in a point to be packed and then light is irradiated. Alternatively, light is previously irradiated to the sealing composition containing the photoreactive composition of the present invention and then the composition may be packed in the point to be packed.

The photoreactive composition of the present invention does not necessarily require continuous irradiation of light until it is completely cured and once light is irradiated, the polymerization reaction or crosslinking reaction is continued even after completion of irradiation of light and thus the photoreactive composition has post-curing property that the curing is promoted with the lapse of time on completion of the irradiation of light. Accordingly, for example, the sealing composition is especially usable for a sealing material, a coating material or the like to be used for a site, e.g. a narrow site, where irradiation of light is difficult or in a place where it hard to continuously radiate light until curing is completed. Further, it is especially useful for application to a material which is sensibly deteriorated by irradiation of light.

In the case the photoreactive composition of the present invention is used for an adhesive for sticking a plurality of objects to be joined one another, when one is a transparent object to be joined, after other objects to be joined are stuck, the adhesive can be cured by light rays which can be transmitted via the transparent object, and therefore, that method can be employed. Further, based on the fact that the photoreactive composition of the present invention is a post-curing composition, object to be joined can be stuck to one another after previous irradiation of light, and therefore, that method can be employed.

The photoreactive composition of the present invention can provide a cured product by applying it to a substrate and irradiating light to it. Depending on the types of utilized hydrolyzable metal compounds, metal oxides (ceramics) and organic-inorganic composites can be obtained. Further, desired patterns can be formed by patterning irradiation of light via a photomask and a partitioning wall, a microlens, a resist material, a color filter material, or the like can be produced. Furthermore, depending on the purposes, a metal oxide, a metal nitride, or a metal carbide film can be produced by heating treatment under oxygen-, nitrogen-, or carbon-containing atmosphere and a patterned film can be obtained. A material as the substrate may be metals such as aluminum, iron, a stainless steel and the like; glass, silicon, resin and the like.

As a coating method of the substrate, known methods such as dip coating, spin coating, spray coating, and roll coating methods can be exemplified.

With respect to the temperature for the heating treatment, when it is too high, since the substrate itself is deteriorated, it is desirable to be a temperature not higher than the withstand temperature of the substrate. Even if a high heat resistant substrate is used, reaction between a film and the substrate may be caused in some cases and the film quality may be sometimes deteriorated.

A metal oxide film and an organic-inorganic composite film can be obtained by using the photoreactive composition of the present invention and further they can be employed for various purposes depending on the metals and organic components. For example, they may be used for a coating material, a conductive material, an insulating material, a semiconductor material, a transparent conductive material, a anti-reflection layer, a partitioning wall, a microlens, a resist material, an optical fiber material, a color filter material, a seal material, a gas permeation film, a gas barrier film and the like.

When the photoreactive composition of the present invention is used, an inorganic film such as a silicon oxide film or the like can be obtained without firing and accordingly, an excellent low dielectric material can be obtained by adding a low dielectric material, which may be lost by firing. That is, since the dielectric constant can be lowered without forming foams, dielectric constant increase or strength deterioration owing to water can be avoided. Further, since these materials can be produced by neither sol-gel method nor firing, it is improbable to produce silanols which increase the dielectric constant. Further, a high dielectric material can be obtained by increasing the metal component ratio and thus materials with optional dielectric constants in a wide range can be obtained.

BEST MODE FOR CARRYING OUT THE INVENTION

Hereinafter, the present invention will be described further in details with reference to Examples, however it is not intended that the present invention be limited to the illustrated Examples.

EXAMPLES 1 TO 8

As a compound (A), MS polymer S-303 (produced by Kanegafuchi Chemical Industry Co., Ltd.) containing a polyoxyalkylene polymer having a functional group represented by the general formula (2-2) at the terminals of polypropyleneglycol was used and as a compound (B), one of compounds selected from maleic anhydride (produced by NACALAI TESQUE, INC.), N-cyclohexylmaleimide (produced by NOF Corporation), and bis(2,4,6-trimethylbenzoyl)-phenylphosphine oxide (produced by Chiba Speciality Chemicals Corp., Irgacure 819) was used and the respective compounds (B) were added to 100 parts by weight of the compound (A) at mixing ratios shown in Table 1 and mixed and stirred under properly heating and light-shielding conditions until the mixtures became even to obtain photoreactive compositions. It was observed that no composition became opaque and all of the obtained compositions were found to be transparent photoreactive compositions.

UV rays in an energy dose of 1,500 mJ/cm$^2$ at 365 nm were irradiated to each of the obtained photoreactive compositions by using a high pressure mercury lamp (manufactured by Toshiba Lightech Co., Ltd., TOSCURE 401). That is, using the high pressure mercury lamp with irradiation intensity of 25 mW/cm$^2$ at 365 nm, UV rays were irradiated for 60 seconds to radiate UV rays with an energy dose of 1,500 mJ/cm$^2$ to the respective compositions.

The stringiness exhibiting time of each photoreactive composition, the gel production, and the thickness after curing after the irradiation of light were measured by the following methods to evaluate the photoreactivity of each photoreactive composition. The results are shown in Table 1.

[Measurement of Stringiness Exhibiting Time]

After each produced photoreactive composition was applied in a thickness of 350 μm to a polyethylene plate and prescribed UV irradiation was carried out, occurrence of stringiness was confirmed by touching the composition with a finger. The time when the stringing took place from the moment immediately after the UV irradiation was represented to be the stringing exhibiting time for the evaluation.

[Measurement of Gelling Ratio]

After each produced composition was applied in a thickness of 350 μm to a polyethylene plate and prescribed UV irradiation was carried out. After the UV irradiation and prescribed curing, a part of the cured product was immersed in tetrahydrofuran at a room temperature for one day and then shaken for 5 hours and after that, the tetrahydrofuran was dried out and removed to quantitatively measure the residue as a gel. The gelling ratio was shown as a gel amount in the composition on the basis of % by weight.

[Measurement of Thickness After Curing]

The each produced composition was poured on a polyethylene plate surrounded with a barrage (height 2 mm) and prescribed UV irradiation was carried out. After the irradiation, the composition was cured in atmosphere at 20° C. and RH 50% under light-shielding condition for one week and the thickness of the produced film was measured as the thickness after curing.

COMPARATIVE EXAMPLE 1

UV rays with an energy dose of 1,500 mJ/cm$^2$ were irradiated to the above-mentioned respective compound (A) and compound (B) used for Examples 1 to 8 by employing the high pressure mercury lamp used in Example 1. After UV irradiation, no viscosity, stringiness, or gel production was observed for any of the compound (A) and compounds (B) after one-month curing at 25° C.

COMPARATIVE EXAMPLE 2

To 100 parts by weight of the compound (A) used for Example 1, 3 parts by weight of a commercialized aromatic onium salt catalyst (SP-170, produced by Asahi Denka Kogyo K.K.) was added and mixed to obtain a composition. The obtained composition had an opaque appearance.

The obtained composition was applied in a thickness of 350 µm to a polyethylene plate and UV rays in an energy dose of 1,500 mJ/cm$^2$ at 365 nm were irradiated by using a high pressure mercury lamp (manufactured by Toshiba Lightech Co., Ltd., TOSCURE 401). Although thin skin-like film formation was observed on the UV irradiated face, no viscosity increase or stringiness was observed for the composition under the skin-like film formation after UV irradiation. Also with respect the state after one month from UV irradiation, no practical change from the state immediately after UV irradiation was observed.

EXAMPLE 9

As a compound (A), 100 parts by weight of MS polymer S-203 (produced by Kanegafuchi Chemical Industry Co., Ltd.) containing a silly having a hydrolyzable functional group at the terminals of polypropyleneglycol and as a compound (B), 5 parts by weight of maleic anhydride (produced by NACALAI TESQUE, INC.) were respectively added and mixed and stirred under properly heating and light-shielding conditions until the mixture became even to obtain a photoreactive composition. The obtained composition was a transparent composition. The obtained composition was subjected to the evaluation same as that for Examples 1 to 8. The results are shown in Table 1.

TABLE 1

|  |  | Example 1 | Example 2 | Example 3 | Example 4 | Example 5 | Example 6 | Example 7 | Example 8 | Example 9 |
|---|---|---|---|---|---|---|---|---|---|---|
| Compound (A) | MS polymer S-303 | 100 | 100 | 100 | 100 | 100 | 100 | 100 | 100 | — |
|  | MS polymer S-203 | — | — | — | — | — | — | — | — | 100 |
| Compound (B) | Maleic anhydride | 0.5 | 1 | 5 | 10 | 20 | — | — | — | 5 |
|  | N-Cyclohexylmaleimide | — | — | — | — | — | 5 | — | — | — |
|  | Bis(2,4,6-trimethylbenzoyl)-phenylphosphine oxide | — | — | — | — | — | — | 1 | 5 | — |
| Irradiation of light energy (mJ/cm$^2$, 365 nm) |  | 1500 | 1500 | 1500 | 1500 | 1500 | 1500 | 1500 | 1500 | 1500 |
| Stringiness exhibiting time (hr) |  | 24 | Immediately after irradiation of light | Immediately after irradiation of light | Immediately after irradiation of light | Immediately after irradiation of light | Immediately after irradiation of light | 17 | 0.66 | Immediately after irradiation of light |
| Gelling ratio (wt %) | Immediately after irradiation of light | <1 | <1 | 22.6 | 21.5 | 22.5 | <1 | <1 | <1 | <1 |
|  | 60 minutes after irradiation of light | <1 | <1 | 7.0 | 26.4 | 25.2 | <1 | <1 | 1.3 | 8.8 |
|  | 180 minutes after irradiation of light | <1 | <1 | 16.2 | 40.0 | 53.0 | <1 | <1 | 14.1 | 7.3 |
|  | 24 hours after irradiation of light | <1 | 3.2 | 51.8 | 67.1 | 77.1 | <1 | <1 | 72.4 | 34.4 |
|  | 4 days after irradiation of light | 2.4 | 12.0 | 85.5 | 88.7 | 85.2 | <1 | 75.2 | 83.2 | 57.7 |
|  | 7 days after irradiation of light | 9.7 | 36.9 | 84.2 | 85.6 | 81.3 | <1 | 78.8 | 84.5 | 57.5 |
| Thickness after curing (mm) |  | 0.3 | 0.5 | >2 | >2 | >2 | 0.5 | >2 | >2 | >2 |

From the results shown in Table 1, the compositions obtained in Examples 1 to 9 were found showing stringiness immediately after irradiation of light or after a while. The thickness after curing was 2 mm or thicker by selecting the mixing amount of the compound (B). Further, in order to investigate the stability of the compositions of the present invention, the compositions of Examples 1 to 9 were left at 25° C. for 1 month under light-shielding condition, however significant viscosity increase or gel formation was not observed.

EXAMPLES 10 TO 13

As a compound (A), MS polymer S-303 (produced by Kanegafuchi Chemical Industry Co., Ltd.) containing a polyoxyalkylene polymer having a functional group represented by the general formula (2-2) at the terminals of polypropyleneglycol was used and as a compound (B), at least one of compounds selected from maleic anhydride (produced by NACALAI TESQUE, INC.) and bis(2,4,6-trimethylbenzoyl)-phenylphosphine oxide (produced by Chiba Speciality Chemicals Corp., Irgacure 819) was used and the respective compounds (B) were added to 100 parts by weight of the compound (A) at mixing ratios shown in Table 2 and mixed and stirred under properly heating and light-shielding conditions until the mixtures became even to obtain photoreactive compositions.

UV rays in an energy dose of as high as ⅓ of that for Examples 1 to 8 were irradiated to the obtained photoreactive compositions and evalution same as that in Examples 1 to 8 was carried out. The results are shown in Table 2.

The obtained photoreactive compositions were subjected to the evaluation same as that in Examples 1 to 8. The results are shown in Table 3.

TABLE 2

|  |  | Example 10 | Example 11 | Example 12 | Example 13 |
|---|---|---|---|---|---|
| Compound(A) | MS polymer S-303 | 100 | 100 | 100 | 100 |
| Compound(B) | Maleic anhydride | 5 | 5 | 5 | 5 |
|  | Bis(2,4,6-trimethylbenzoyl)-phenylphosphine oxide | — | 0.5 | 1 | 5 |
| Irradiation of light energy (mJ/cm², 365 nm) |  | 500 | 500 | 500 | 500 |
| Stringiness exhibiting time (hr) |  | 20 minutes | 3 minutes | Immediately after irradiation of light | Immediately after irradiation of light |
| Gelling ratio (wt %) | Immediately after irradiation of light | <1 | <1 | 1.2 | 5.3 |
|  | 5 minutes after irradiation of light | <1 | <1 | 3.9 | 34.1 |
|  | 30 minutes after irradiation of light | <1 | 4.2 | 14.0 | 21.7 |
|  | 60 minutes after irradiation of light | <1 | 8.1 | 22.5 | 34.1 |
|  | 2 hours after irradiation of light | <1 | 10.3 | 26.6 | 44.9 |
|  | 6 hours after irradiation of light | <1 | 32.7 | 53.5 | 80.1 |
|  | 24 hours after irradiation of light | 2.0 | 71.5 | 79.6 | 85.1 |
|  | 2 days after irradiation of light | 7.5 | 78.2 | 85.7 | 85.4 |
|  | 5 days after irradiation of light | 47.2 | 86.1 | 88.8 | 88.3 |
|  | 7 days after irradiation of light | 74.1 | 88.1 | 87.9 | 88.9 |
| Thickness after curing (mm) |  | 0.5 | >2 | >2 | >2 |

From the results shown in Table 2, owing to combination of the compounds (B), stringiness and gel formation were observed even by low irradiation of light energy. Film curing with a thickness after curing of 2 mm or thicker was also observed.

EXAMPLES 14 AND 15

As a compound (A), 100 parts by weight of MS polymer S-303 (produced by Kanegafuchi Chemical Industry Co., Ltd.) containing a polyoxyalkylene polymer having a functional group represented by the general formula (2-2) at the terminals of polypropyleneglycol was used and mixed with, as a compound (B), 1 part by weight of maleic anhydride (produced by NACALAI TESQUE, INC.) and further mixed with, as a photoradical generating agent (C), 1 part by weight of Irgacure 651 or isopropylthioxanthone and mixed and stirred under properly heating and light-shielding conditions until the mixtures became even to obtain photoreactive compositions.

COMPARATIVE EXAMPLES 3 AND 4

Compositions were produced same as those of Examples 14 and 15 except that no maleic anhydride (produced by NACALAI TESQUE, INC.) was added and subjected to the same evaluation. The results are shown in Table 3.

TABLE 3

|  |  | Example 14 | Example 15 | Comparative Example 3 | Comparative Example 4 |
|---|---|---|---|---|---|
| Compound(A) | MS polymer S-303 | 100 | 100 | 100 | 100 |
| Compound(B) | Maleic anhydride | 1 | 1 | — | — |
| Compound(C) | Irgacure 651 | 1 | — | 1 | — |
|  | Isopropylthioxanthone | — | 1 | — | 1 |
| Irradiation of light energy (mJ/cm², 365 nm) |  | 1500 | 1500 | 1500 | 1500 |
| Stringiness exhibiting time (hr) |  | Immediately after irradiation of light | Immediately after irradiation of light | No stringiness observed | No stringiness observed |
| Gelling ratio (wt %) | Immediately after irradiation of light | <1 | <1 | <1 | <1 |
|  | 60 minutes after irradiation of light | <1 | 12.2 | <1 | <1 |
|  | 24 hours after irradiation of light | <1 | 14.5 | <1 | <1 |
|  | 4 days after irradiation of ligh | 24.0 | 13.8 | <1 | <1 |
|  | 7 days after irradiation of light | 33.7 | 17.3 | <1 | <1 |
| Thickness after curing (mm) |  | 1 | 0.7 | No cured film formed | No cured film formed |

From the results shown in Table 3, it was found that further addition of the photoradical generating agents (C) quickened the gel formation speed and the thickness of the cured film became thick as compared with that in Example 2.

EXAMPLES 16 TO 24

As a compound (A), MS polymer S-303 (produced by Kanegafuchi Chemical Industry Co., Ltd.) containing a polyoxyalkylene polymer having a functional group represented by the general formula (2-2) at the terminals of polypropyleneglycol was used and to 100 parts by weight of the compound, 5 parts by weight of maleic anhydride (produced by NACALAI TESQUE, INC.) as a compound (B), 1 part by weight of Irgacure 819 as a photoradical generating agent (C), and further one of compounds selected from Aronix M-110, Aronix M-1310, Aronix M-270, cyclohexyl acrylate, and n-butyl acrylate as a compound (F) were added and mixed and stirred under properly heating and light-shielding conditions until the mixtures became even to obtain photoreactive compositions.

Incidentally, Irgacure 819 is a compound having the properties as the compound (B) and also the properties as the compound (C).

UV rays in 500 mJ/cm$^2$ dose were irradiated to the obtained photoreactive compositions to carry out evaluation similar to that in Examples 1 to 8. Further, the coagulating force was evaluated by the following method. The results are shown in Table 4.

[Measurement of Coagulating Force]

A coat A in a size of 25 mm×25 mm×0.3 mm was obtained by applying each of the obtained photoreactive composition to an end part of a transparent acrylic plate (an object to be stuck A, 25 mm×120 mm×2 mm). Another object to be stuck A was stuck to the coat A so as to carry out a tension shear test and UV rays in a prescribed energy dose (a high pressure mercury lamp, TOSCURE 401 manufactured by Toshiba Lightech Co., Ltd.) were irradiated to obtain an evaluation sample.

Either immediately after the production or after irradiation of light in atmosphere at 20° C. and RH 50%, each obtained sample was subjected to the tension shear test (cross head speed of 300 mm/min) according to JIS K 6852 after prescribed times as shown in Table 4 and the maximum stress was represented as the coagulating force.

From the results shown in Table 4, the photoreactive compositions produced in Examples 16 to 24 were found showing high coagulating force as compared with that of the composition of Example 12 containing no compound (F).

EXAMPLES 25 AND 26

As a compound (A), MS polymer S-303 (produced by Kanegafuchi Chemical Industry Co., Ltd.) containing a polyoxyalkylene polymer having a functional group represented by the general formula (2-2) at the terminals of polypropyleneglycol was used and to 100 parts by weight of the compound, 5 parts by weight of maleic anhydride (produced by NACALAI TESQUE, INC.) and 1 part by weight of Irgacure 819 as compounds (B), and 1 or 2 parts by weight of 1,1,3,3-tetrabutyl-1,3-dilauryloxycarbonyl distannoxane (U-130 produced by Nitto Kasei Co., Ltd.) as an organometal compound (E) were added and mixed and stirred under properly heating and light-shielding conditions until the mixtures became even to obtain photoreactive compositions.

UV rays in 500 mJ/cm$^2$ dose were irradiated to the obtained photoreactive compositions to carry out evaluation similar to that in Examples 1 to 8. Further, the coagulating force was evaluated by the following method. The results are shown in Table 5.

Further, a coat in a thickness of 350 μm was formed on a polyethylene plate using the photoreactive composition obtained in Example 26 and after a portion of the coat was shielded from light by an aluminum sheet, light rays in 500 mJ/cm$^2$ dose (365 nm) were irradiated to observe the curing property. The composition in the light-irradiated portion showed the above-mentioned gelling behavior. On the other hand, the portion which was shielded from light by the aluminum sheet was found showing no stringiness imme-

TABLE 4

| | | Example 16 | Example 17 | Example 18 | Example 19 | Example 20 | Example 21 | Example 22 | Example 23 | Example 24 |
|---|---|---|---|---|---|---|---|---|---|---|
| Compound(A) | MS polymer S-303 | 100 | 100 | 100 | 100 | 100 | 100 | 100 | 100 | 100 |
| Compound(B) | Maleic anhydride | 5 | 5 | 5 | 5 | 5 | 5 | 5 | 5 | 5 |
| Compound(C) | Irgacure 891 | 1 | 1 | 1 | 1 | 1 | 1 | 1 | 1 | 1 |
| Compound(F) | AronixM-110 | 10 | 50 | 100 | 300 | — | — | — | — | — |
| | Aronix M-1310 | — | — | — | — | 50 | — | — | — | — |
| | Aronix M-270 | — | — | — | — | — | 50 | 100 | — | — |
| | Cyclohexyl acrylate | — | — | — | — | — | — | — | 50 | — |
| | n-Butyl acrylate | — | — | — | — | — | — | — | — | 50 |
| Irradiation of light energy (mJ/cm$^2$, 365 nm) | | 500 | 500 | 500 | 500 | 500 | 500 | 500 | 500 | 500 |
| Stringiness exhibiting time (hr) | | Immediately after irradiation of light | Immediately after irradiation of light | Immediately after irradiation of light | Immediately after irradiation of light | Immediately after irradiation of light | Immediately after irradiation of light | Immediately after irradiation of light | Immediately after irradiation of light | Immediately after irradiation of light |
| Gelling ratio (wt %) | Immediately after irradiation of light | 5.1 | 24.1 | 43.5 | 68.4 | 27.6 | 26.4 | 54.2 | <1 | <1 |
| | 6 hours after irradiation of light | 57.1 | 64.1 | 63.5 | 79.4 | 63.1 | 61.1 | 68.7 | 27.8 | 23.5 |
| | 24 hours after irradiation of light | 84.2 | 83.4 | 87.1 | 90.3 | 86.5 | 85.5 | 87.4 | 50.9 | 48.1 |
| Thickness after curing (mm) | | >2 | >2 | >2 | >2 | >2 | >2 | >2 | >2 | >2 |
| Coagulating force (kg/cm$^2$) ((kPa)) | Immediately after irradiation of light | 0.11 (10.8) | 0.43 (42.1) | 0.64 (62.7) | 1.5 (147.0) | 0.67 (65.7) | 1.17 (114.7) | 1.61 (157.8) | 0.45 (44.1) | 0.33 (32.3) |
| | 6 hours after irradiation of light | 4.3 (421.4) | 7.0 (686.0) | 8.9 (872.2) | 9.4 (921.2) | 7.9 (774.2) | 5.1 (499.8) | 5.6 (548.8) | 2.9 (284.2) | 2.7 (264.6) |
| | 24 hours after irradiation of light | 7.6 (744.8) | 9.8 (960.4) | 12.2 (1196) | 18.4 (1803) | 11.3 (1107) | 7.1 (695.8) | 7.2 (705.6) | 6.8 (666.4) | 5.1 (499.8) | diately after the coat, however showed gelling (at gelling ratio 62 wt. %) after 24 hours. Gelling ratio finally reached 85 wt. % after 7 day-curing.

COMPARATIVE EXAMPLES 5 AND 6

Compositions were produced in the same manner as Examples 25 and 26, except that no compound (B) was added and subjected to similar evaluation. The results are shown in Table 5.

TABLE 5

|  |  | Example 25 | Example 26 | Comparative Example 5 | Comparative Example 6 |
|---|---|---|---|---|---|
| Compound(A) | MS polymer S-303 | 100 | 100 | 100 | 100 |
| Compound(B) | Maleic anhydride | 5 | 5 | — | — |
|  | Irgacure 819 | 1 | 1 | — | — |
| Compound(E) | 1,1,3,3-Tetrabutyl-1,3-dilauryloxycarbonyl distannoxane | 1 | 2 | 1 | 2 |
| Irradiation of light energy (mJ/cm$^2$, 365 nm) |  | 500 | 500 | 500 | 500 |
| Stringiness exhibiting time (hr) |  | Immediately after irradiation of light | Immediately after irradiation of light | — | — |
| Gelling ratio (wt %) | Immediately after irradiation of light | 2.1 | 2.4 | <1 | <1 |
|  | 30 minutes after irradiation of light | 15.5 | 5.5 | <1 | <1 |
|  | 1 hour after irradiation of light | 40.5 | 18.5 | <1 | <1 |
|  | 2 hours after irradiation of light | 70.0 | 67.2 | <1 | <1 |
|  | 6 hours after irradiation of light | 89.3 | 89.0 | <1 | <1 |
|  | 24 hours after irradiation of light | 88.5 | 87.0 | 62 | 65 |
| Thickness after curing (mm) |  | >2 | >2 | >2 | >2 |

From the results shown in Table 5, the photoreactive compositions obtained in Examples 25 and 26 were found showing gelling speed about 4 times as high as that of the composition of Example 12 which contained no compound (E).

EXAMPLES 27 TO 30

Photoreactive compositions with the mixing ratios as shown in Table 6 were produced and they were used as adhesives.

The tensile shear strength and peel creep strength were evaluated by the following methods. The results are shown in Table 6.

[Measurement of Tensile Shear Strength]

A coat B in a size of 25 mm×25 mm×0.3 mm was obtained by applying each of the obtained photoreactive composition to a slate (an object to be stuck B, 25 mm×120 mm×1 mm). After UV rays in 500 mJ/cm$^2$ energy dose (a high pressure mercury lamp, TOSCURE 401 manufactured by Toshiba Lightech Co., Ltd.) were irradiated to the coat B, another object to be stuck C (a hot dip zinc-coated steel plate JIS G 3302, 25 mm×120 mm×0.3 mm) was stuck so as to carry out a tension shear test and obtain an evaluation sample.

After curing for a prescribed duration in atmosphere at 20° C. and RH 50%, each obtained sample was subjected to the tension shear test according to JIS K 6852 (cross head speed of 50 mm/min) and the maximum stress was represented as the tensile shear strength.

[Measurement of Peel Creep Strength]

A coat D in a size of width 25 mm×thickness 0.3 mm was obtained by applying each of the obtained photoreactive composition to a slate (an object to be stuck D, 50 mm×120 mm×1 mm). After UV rays in 500 mJ/cm$^2$ energy dose (a high pressure mercury lamp, TOSCURE 401 manufactured by Toshiba Lightech Co., Ltd.) were irradiated to the coat D, another object to be stuck C (a hot dip zinc-coated steel plate JIS G 3302, 25 mm×120 mm×0.3 mm), which was previously bent at right angles in the center of the longitudinal direction was stuck to obtain an evaluation sample.

After curing of the obtained sample for a prescribed duration in atmosphere at 20° C. and RH 50%, the object to be stuck D was fixed in such a manner that the object to be stuck C was set in the lower side in the same atmosphere and a load of 400 g was hung on the portion where no object to be stuck C was stuck. The peel creep strength was evaluated based on the duration to the time when the load was dropped or the peeling length after 1 hour.

TABLE 6

|  |  | Example 27 | Example 28 | Example 29 | Example 30 |
|---|---|---|---|---|---|
| Compound(A) | MS polymer S-303 | 100 | 100 | 100 | 100 |
| Compound(B) | Maleic anhydride | 5 | 5 | 5 | 5 |
| Compound(C) | Irgacure 819 | 1 | 1 | 1 | 1 |
| Compound(F) | Aronix M-110 | 15 | 10 | 10 | 10 |
|  | Aronix M-1310 | — | 5 | — | 5 |
|  | Isomyristyl acrylate | 10 | — | — | — |
|  | KRM7735 | — | — | 5 | — |
| Compound(E) | 1,1,3,3-Tetrabutyl-1,3-dilauryloxycarbonyl distannoxane | 2 | 2 | 2 | — |
|  | Dibutyltin diacetylacetonate | — | — | — | 2 |

TABLE 6-continued

|  |  | Example 27 | Example 28 | Example 29 | Example 30 |
|---|---|---|---|---|---|
| Other additives | Surface-treated calcium carbonate | 40 | 40 | 70 | 70 |
|  | Silica | 100 | 100 | 70 | 70 |
|  | Vinyltrimethoxysilane | 3 | 3 | 3 | 3 |
|  | Hydrocarbon resin | 5 | — | — | — |
| Tensile shear strength (N/cm$^2$) | Immediately after sticking without irradiation of light | <1.96 | <1.96 | <1.96 | <1.96 |
|  | Within 10-seconds curing | 4.116 | 4.998 | 4.802 | 5.194 |
|  | After 5-minutes curing | 23.912 | 30.576 | 28.224 | 31.556 |
|  | After 30-minutes curing | 60.172 | 69.482 | 79.478 | 70.756 |
|  | After 24-hours curing | 92.61 | 118.58 | 114.66 | 116.62 |
| Peel creep strength (peeling length, mm) | Immediately after sticking without irradiation of light | 100< | 100< | 100< | 100< |
|  | After 5-minutes curing | <1 | <1 | 100< | 100< |
|  | After 10-minutes curing | <1 | <1 | <1 | <1 |
|  | After 30-minutes curing | <1 | <1 | <1 | <1 |

EXAMPLE 31

The photoreactive composition produced in Example 27 was used as a sealing material by filling a joint part with the photoreactive composition and irradiation light in 500 mJ/cm$^2$ dose (365 nm).

After 10 minutes from irradiation of light, the composition became tack-free and became like rubber after 24 hours at a room temperature.

EXAMPLES 32 TO 40

Photoreactive compositions with the mixing ratios as shown in Table 7 were produced and they were used as adhesives.

The tensile shear strength and peel creep strength were evaluated by the above-mentioned methods and further T-peel strength was measured by the following method. The results are shown in Table 7.

[Measurement of T-Peel Strength]

A coat C in a size of 25 mm×25 mm×0.3 mm was obtained by applying each of the obtained photoreactive composition to an object to be stuck C, a hot dip zinc-coated steel plate, (JIS G 3302, 25 mm×120 mm×0.3 mm), which was previously bent at right angles in the center of the longitudinal direction. After UV rays in 500 mJ/cm$^2$ energy dose (a high pressure mercury lamp, TOSCURE 401 manufactured by Toshiba Lightech Co., Ltd.) were irradiated to the coat C, another object to be stuck C, which was previously bent at right angles in the center of the longitudinal direction was stuck to obtain an evaluation sample.

After curing of the obtained sample for a prescribed duration in atmosphere at 20° C. and RH 50%, the tensile strength test was carried out (cross head speed of 500 mm/min) was carried out and the maximum stress was represented as the T-peel strength.

TABLE 7

|  |  | Example 32 | Example 33 | Example 34 | Example 35 | Example 36 | Example 37 | Example 38 | Example 39 | Example 40 |
|---|---|---|---|---|---|---|---|---|---|---|
| Compound (A) | MS polymer S-303 | 100 | 100 | 100 | 100 | 100 | 100 | 100 | 100 | 100 |
| Compound (B) | Maleic anhydride | 10 | 10 | 10 | 10 | 10 | 10 | 10 | 10 | 10 |
| Compound (C) | Irgacure 819 | 1 | 1 | 1 | 1 | 1 | 1 | 1 | 1 | 1 |
| Compound (F) | Aronix M-110 | 15 | 15 | 15 | 15 | 15 | 15 | 15 | 15 | 15 |
| Compound (E) | Dibutyltin diacetylacetonate | 2 | 2 | 2 | 2 | 2 | 2 | 2 | 2 | 2 |
| Compound (G) | Blfunctional epoxy resin (Epikote 834) | — | 5 | — | — | — | — | — | — | — |
|  | Tetrafunctional epoxy resin (Epikote 604) | — | — | 5 | — | — | — | — | — | — |
|  | Tetrafunctional epoxy resin (Epoleed GT 403) | — | — | — | 5 | — | — | 2 | 10 | — |
|  | γ-Glycidoxypropylmethyldiethoxysilane | — | — | — | — | 5 | — | — | — | — |
|  | β-(-epoxycyclohexyl)ethyltrimethoxysilane | — | — | — | — | — | 5 | — | — | 10 |
| Other additives | Surface-treated calcium carbonate | 70 | 70 | 70 | 70 | 70 | 70 | 70 | 70 | 70 |
|  | Silica | 70 | 70 | 70 | 70 | 70 | 70 | 70 | 70 | 70 |
|  | Vinyltrimethoxysilane | 3 | 3 | 3 | 3 | 3 | 3 | 3 | 3 | 3 |
| T-peel strength (N/cm$^2$) |  | 50.96 | 72.52 | 135.24 | 141.12 | 115.64 | 115.64 | 84.24 | 101.92 | 123.48 |
| Tensile shear strength | Immediately after sticking without irradiation of light | <1.96 | <1.96 | <1.96 | <1.96 | <1.96 | <1.96 | <1.96 | <1.96 | <1.96 |
|  | Within 10-second curing | 4.704 | 4.508 | 4.9 | 5.684 | 4.998 | 4.9 | 4.508 | 5.684 | 4.214 |

TABLE 7-continued

|  |  | Example 32 | Example 33 | Example 34 | Example 35 | Example 36 | Example 37 | Example 38 | Example 39 | Example 40 |
|---|---|---|---|---|---|---|---|---|---|---|
| (N/cm$^2$) | After 5-minute curing | 27.93 | 27.44 | 32.438 | 35.672 | 27.048 | 26.754 | 27.538 | 35.476 | 26.852 |
|  | After 30-minute curing | 78.596 | 79.87 | 92.414 | 99.96 | 86.73 | 87.808 | 79.38 | 107.8 | 88.004 |
|  | After 24-hour curing | 106.82 | 112.7 | 147.98 | 151.9 | 132.3 | 135.24 | 109.76 | 150.92 | 138.18 |
| Peel creep strength (peeling length, mm) | Immediately after sticking without irradiation of light | 100< | 100< | 100< | 100< | 100< | 100< | 100< | 100< | 100< |
|  | After 5-minute curing | 100< | 100< | 100< | 100< | 100< | 100< | 100< | 100< | 100< |
|  | After 10-minute curing | <1 | <1 | <1 | <1 | <1 | <1 | <1 | <1 | <1 |
|  | After 30-minute curing | <1 | <1 | <1 | <1 | <1 | <1 | <1 | <1 | <1 |

From the results shown in Table 7, the photoreactive compositions obtained in Examples 33 to 40 were found having improved T-peel strength as compared with that of the photoreactive composition of Example 32 obtained without containing the compound (G). Further, in the case of Examples 36, 37, and 40 for which compounds having hydrolyzable silyl groups represented by the general formula (2-2) were used for the compound (G) and Examples 34, 35, 38, and 39 for which compounds having three or more epoxy groups in the compound (G), effects to further improve the T-peel strength were confirmed.

EXAMPLES 41 TO 46

As the polymer (A), polymers (A1, A2, and A3) obtained by copolymerization of butyl acrylate and 3-acryloxypropyltrimethoxysilane (KBM-5103 produced by Shin-Etsu Chemical Co., Ltd.) having silyl group having a hydrolyzable functional group at the mixing ratios shown in Table 8 were used and to 100 parts by weight of the polymer (A), as the compound (B), maleic anhydride (produced by NACALAI TESQUE, INC.) and bis(2,4,6-trimethylbenzoyl)-phenylphosphine oxide (Irgacure 819, produced by Chiba Speciality Chemicals Corp.) were added in ratios as shown in Table 9 and the polymer (A) and the compound (B) were mixed and stirred under properly heating and light-shielding conditions until the mixtures became even to obtain photoreactive compositions. It was observed that no composition became opaque and all of the obtained compositions were found to be transparent compositions.

After UV rays in an energy dose of 500 mJ/cm$^2$ (365 nm) were irradiated by using a high pressure mercury lamp (manufactured by Toshiba Lightech Co., Ltd., TOSCURE 401) to the photoreactive compositions obtained in Examples 41 to 46, the stringiness exhibiting time, the gelling ratio, and the thickness after curing were measured by the above-mentioned methods. The results are shown in Table 9.

Further, in order to investigate the stability of the photoreactive compositions, the photoreactive compositions were left at 25° C. for 1 month under light-shielding condition, however significant viscosity increase or gel formation was not observed.

COMPARATIVE EXAMPLE 7

UV rays with an energy dose of 500 mJ/cm$^2$ were irradiated to the respective polymers (A1, A2, and A3) produced in Examples 41 to 46. After UV irradiation, no viscosity, stringiness, or gel production was observed after one-month curing at 25° C.

EXAMPLES 47 TO 49

Photoreactive compositions were obtained in the same manner as Examples 41 to 46, except that polymers (A4, A5, and A6) obtained by copolymerizing a variety of acrylic acid esters, ethyl acrylate, 2-ethylhexyl acrylate, and cyclohexyl acrylate, as the polymer (A), at the mixing ratios shown in Table 8 with 3-acryloxypropyltrimethoxysilane (KBM-5103 produced by Shin-Etsu Chemical Co., Ltd.) having silyl group having a hydrolyzable functional group were used in place of the polymers (A1, A2, and A3) and subjected to the evaluation. The results are shown in Table 9. The obtained photoreactive compositions were transparent compositions.

TABLE 8

|  | Polymer A1 | Polymer A2 | Polymer A3 | Polymer A4 | Polymer A5 | Polymer A6 |
|---|---|---|---|---|---|---|
| Butyl acrylate | 99 | 95 | 90 | — | — | — |
| Ethyl acrylate | — | — | — | 99 | — | — |
| 2-Ethylhexyl acrylate | — | — | — | — | 99 | — |
| Cyclohexyl acrylate | — | — | — | — | — | 99 |
| 3-Acryloxypropyl trimethoxysilane | 1 | 5 | 10 | 1 | 1 | 1 |

TABLE 9

|  |  | Example 41 | Example 42 | Example 43 | Example 44 | Example 45 | Example 46 | Example 47 | Example 48 | Example 49 |
|---|---|---|---|---|---|---|---|---|---|---|
| Compound(A) | Polymer A1 | 100 | 100 | — | — | — | — | — | — | — |
|  | Polymer A2 | — | — | 100 | 100 | — | — | — | — | — |
|  | Polymer A3 | — | — | — | — | 100 | 100 | — | — | — |
|  | Polymer A4 | — | — | — | — | — | — | 100 | — | — |
|  | Polymer A5 | — | — | — | — | — | — | — | 100 | — |
|  | Polymer A6 | — | — | — | — | — | — | — | — | 100 |

TABLE 9-continued

|  |  | Example 41 | Example 42 | Example 43 | Example 44 | Example 45 | Example 46 | Example 47 | Example 48 | Example 49 |
|---|---|---|---|---|---|---|---|---|---|---|
| Compound(B) | Maleic anhydride | 5 | — | 5 | — | 5 | — | 5 | 5 | 5 |
|  | Irgacure 819 | — | 1 | — | 1 | — | 1 | — | — | — |
| Irradiation of light dose (mJ/cm², 365 nm) | | 500 | 500 | 500 | 500 | 500 | 500 | 500 | 500 | 500 |
| Stringiness exhibiting time (hr) | | 6 | Immediately | 6 | Immediately | 6 | Immediately | 6 | 6 | 6 |
| Gelling ratio (wt. %) | Immediately after irradiation of light | <1 | 75 | <1 | 87 | <1 | 74 | <1 | <1 | <1 |
|  | 15 minutes after irradiation of light | <1 | 78 | <1 | 87 | <1 | 80 | <1 | <1 | <1 |
|  | 30 minutes after irradiation of light | <1 | 80 | <1 | 88 | <1 | 90 | <1 | <1 | <1 |
|  | 60 minutes after irradiation of light | <1 | 82 | <1 | 90 | <1 | 93 | <1 | <1 | <1 |
|  | 180 minutes after irradiation of light | <1 | 84 | <1 | >97 | <1 | 95 | <1 | <1 | <1 |
|  | 24 hours after irradiation of light | <1 | >85 | <1 | >97 | <1 | >95 | 3 | <1 | <1 |
|  | 4 days after irradiation of light | 35 | >85 | 40 | >97 | 40 | >95 | 6 | 10 | <1 |
|  | 7 days after irradiation of light | 50 | >85 | 75 | >97 | 70 | >95 | 68 | 30 | 2 |
|  | 14 days after irradiation of light | 75 | >85 | 88 | >97 | >95 | >95 | 76 | 55 | 60 |
|  | 21 days after irradiation of light | 81 | >85 | >95 | >97 | >95 | >95 | >82 | 68 | 75 |
|  | 28 days after irradiation of light | 82 | >85 | >95 | >97 | >95 | >95 | >82 | 70 | >75 |
| Thickness after curing (mm) | | >2 | >2 | >2 | >2 | >2 | >2 | >2 | >2 | >2 |

From the results shown in Table 9, the photoreactive compositions obtained in Examples were found showing the stringiness immediately after the irradiation of light or after a while. The thickness after curing was as thick as 2 mm or thicker by selecting the mixing amount of the compound (B).

EXAMPLES 50 TO 58

The composition components at the mixing ratios shown in Table 10 and Table 11 were mixed and stirred under properly heating condition until the mixtures became even to obtain photoreactive compositions. It was observed that no composition became opaque and all of the obtained compositions were found to be transparent photoreactive compositions.

Each of the obtained photoreactive compositions about 100 g was subjected to bubbling with nitrogen gas for 5 minutes to remove oxygen dissolved in the composition and then photoreaction was carried out.

UV rays in an energy dose of 500 mJ/cm² (365 nm) were irradiated to each of the obtained photoreactive compositions by using a high pressure mercury lamp (manufactured by Toshiba Lightech Co., Ltd., TOSCURE 401) and the gelling ratio and the cured thickness were measured by the above-mentioned methods and the swelling ratio of the produced gel was measured by the following method. The results are shown in Table 10 and Table 11.

[Measurement of Swelling Ratio of Produced Gel]

With respect to gel obtained at the time of measuring the gelling ratio before drying out tetrahydrofuran, the weight of gel impregnated with tetrahydrofuran was measured and the weight ratio before and after the tetrahydrofuran in the gel was removed by drying was represented as the swelling ratio. That is, the ratio was

TABLE 10

|  |  | Example 50 | Example 51 | Example 52 | Example 53 |
|---|---|---|---|---|---|
| Compound(A) | 3-Trimethoxysilylpropyl acrylate | 100 | 100 | 100 | 100 |
| Compound(B) | Maleic anhydride | 5 | 2 | 5 | — |
| Compound | Bis(2,4,6-trimethylbenzoyl)-phenylphosphonoxide | — | 1 | 1 | 5 |
| Compound(C) | Irgacure 651 | 1 | — | — | — |
| Irradiation of light dose (mJ/cm², 365 nm) | | 500 | 500 | 500 | 500 |
| Gelling ratio (wt. %)/ Swelling ratio | Immediately after irradiation of light | 70.2/19.3 | 61.8/28.7 | 70.5/17.0 | 70.2/18.2 |
|  | 60 minutes after irradiation of light | 72.2/17.2 | 63.7/26.3 | 73.2/15.4 | 74.9/14.5 |
|  | 180 minutes after irradiation of light | 76.6/13.5 | 67.1/21.2 | 76.6/12.8 | 75.1/11.8 |
|  | 24 hours after irradiation of light | 84.6/6.4 | 86.1/7.5 | 86.1/6.4 | 85.7/6.7 |
|  | 4 days after irradiation of light | 85.2/4.1 | 83.7/5.3 | 88.4/4.3 | 90.4/4.0 |
|  | 7 days after irradiation of light | 85.7/4.0 | 85.4/5.0 | 89.6/3.9 | 91.1/3.5 |
| Thickness after curing (mm) | | >2 | >2 | >2 | >2 |

TABLE 11

|  |  | Example 54 | Example 55 | Example 56 | Example 57 | Example 58 |
|---|---|---|---|---|---|---|
| Compound(A) | 3-Trimethoxysilylpropyl acrylate | 50 | 80 | — | 50 | 5 |
|  | 3-Trimethoxysilylpropyl methacrylate | — | — | 500 | — | — |
| Compound(B) | Maleic anhydride | 5 | 5 | 5 | 5 | 5 |

TABLE 11-continued

|  |  | Example 54 | Example 55 | Example 56 | Example 57 | Example 58 |
|---|---|---|---|---|---|---|
| Compound | Bis(2,4,6-trimethylbenzoyl)-phenylphosphine oxide | 1 | 1 | 1 | 1 | 1 |
| Compound(D) | 2-Ethylhexyl acrylate | 5 | 20 | 50 | — | — |
|  | Aronix M-110 | — | — | — | 50 | 95 |
| Irradiation of light dose (mJ/cm$^2$, 365 nm) |  | 500 | 500 | 500 | 500 | 500 |
| Gelling ratio | Immediately after irradiation of light | 78.8/13.6 | 74.0/14.8 | 77.0/12.4 | 77.5/12.5 | 84.5/6.8 |
| (wt. %)/ | 60 minutes after irradiation of light | 81.9/13.4 | 75.8/13.6 | 79.5/12.8 | 80.1/11.7 | 86.1/6.6 |
| Swelling ratio | 180 minutes after irradiation of light | 83.4/10.2 | 82.3/11.4 | 80.7/11.9 | 81.2/9.1 | 86.5/6.1 |
|  | 24 hours after irradiation of light | 83.6/7.2 | 85.2/6.0 | 82.4/8.6 | 80.5/5.4 | 82.6/4.7 |
|  | 4 days after irradiation of light | 85.1/4.2 | 87.6/4.1 | 84.5/5.3 | 80.6/3.7 | 82.9/3.1 |
|  | 7 days after irradiation of light | 84.8/3.7 | 88.1/3.9 | 85.4/4.7 | 80.9/3.5 | 83.5/2.9 |
| Thickness after curing (mm) |  | >2 | >2 | >2 | >2 | >2 |

From the results shown in Table 10 and Table 11, the photoreactive compositions obtained in Examples 50 to 58 were found forming cured coats immediately after the irradiation of light and the thickness reached 2 mm or thicker. The gelling ratios of the compositions were increased with the lapse of time, meanwhile the swelling ratios were decreased with the lapse of time, showing that the gel formation and dense crosslinking were being promoted with the lapse of time.

Further, in order to investigate the stability, the compositions were left at 25° C. for 1 month under light-shielding condition, however significant viscosity increase or gel formation was not observed.

EXAMPLES 59 TO 62

The composition components at the mixing ratios shown in Table 12 were mixed and stirred under properly heating condition until the mixtures became even to obtain photoreactive compositions. It was observed that no composition became opaque and all of the obtained compositions were found transparent.

Each of the obtained compositions about 100 g was subjected to bubbling with nitrogen gas for 5 minutes to remove oxygen dissolved in the composition and then photoreaction was carried out.

After UV rays in an energy dose of 1,000 mJ/cm$^2$ (365 nm) were irradiated to each of the obtained photoreactive compositions by using a high pressure mercury lamp (manufactured by Toshiba Lightech Co., Ltd., TOSCURE 401), the stringiness exhibiting time, the gelling ratio and the cured thickness were measured by the above-mentioned methods. The results are shown in Table 12.

TABLE 12

|  |  | Example 59 | Example 60 | Example 61 | Example 62 |
|---|---|---|---|---|---|
| Compound(A) | MS polymer S-303 | 50 | 90 | 50 | 50 |
| Compound(B) | Maleic anhydride | 5 | 5 | 5 | 5 |
|  | Irgacure 819 | 1 | 1 | 1 | 1000 |
| Compound(C) | Bisphenol A type epoxy resin | 50 | 10 | 50 | — |
|  | Hydrogenated bisphenol A type epoxy resin | — | — | — | 50 |
| Compound(F) | UVI-6990 produced by Union Carbide Corp. | 3 | 3 | — | 3 |
|  | SP-170 produced by Asahi Denka Kogyo K. K. | — | — | 3 | — |
| Irradiation of light dose (mJ/cm$^2$, 365 nm) |  | 1000 | 1000 | 1000 | 1000 |
| Stringiness exhibiting time (hr) |  | 0.5 | 0.17 | 0.5 | 24 |
| Gelling ratio | Immediately after irradiation of light | 0.3 | 2.8 | 0.4 | 0.3 |
| (wt. %) | 60 minutes after irradiation of light | 10.3 | 17.6 | 6.5 | 0.5 |
|  | 180 minutes after irradiation of light | 12.8 | 26.2 | 11.5 | 0.6 |
|  | 24 hours after irradiation of light | 32.1 | 51.8 | 34.9 | 0.8 |
|  | 4 days after irradiation of light | 42.3 | 68.5 | 38.9 | 16.4 |
|  | 7 days after irradiation of light | 50.1 | 81.4 | 42.6 | 37.1 |
| Thickness after curing (mm) |  | >2 | >2 | >2 | >2 |

From the results shown in Table 12, although the stringiness exhibiting time differed for the respective compositions, the gelling ratios were increased with the lapse of time and the thickness reached 2 mm or thicker. Further, in order to investigate the stability, the compositions were left at 25° C. for 1 month under light-shielding condition, however significant viscosity increase or gel formation was not observed.

EXAMPLES 63 TO 77

As the polymer (A), a compound containing silyl group having a hydrolyzable functional group at the terminals of polyisobutylene, Epion EP-103S (produced by Kanegafuchi Chemical Industry Co., Ltd.) was used and as the compound (B) and the compound (C), compounds shown in Table 13 and Table 14 were used, and the composition components at the mixing ratios shown in Table 13 and Table 14 were mixed and stirred under properly heating condition until the mixtures became even to obtain photoreactive compositions. It was observed that no composition became opaque and all of the obtained compositions were found transparent.

After UV rays in energy dose levels (365 nm) shown in Table 13 and Table 14 were irradiated to each of the obtained photoreactive compositions by using a high pressure mercury lamp (manufactured by Toshiba Lightech Co., Ltd., TOSCURE 401), the stringiness exhibiting time and the gelling ratio were measured by the above-mentioned methods. The results are shown in Table 13 and Table 14.

COMPARATIVE EXAMPLE 8

A moisture-curing catalyst 2 parts by weight was added to a compound EP-103S (produced by Kanegafuchi Chemical Industry Co., Ltd.) 100 parts by weight as the polymer (A) and mixed and stirred under properly heating condition until the mixture became even to obtain a composition. The composition was evaluated in the same manner as Examples 63 to 67. The results are shown in Table 13 and Table 14.

COMPARATIVE EXAMPLE 9

2 parts by weight of a phosphonium antimonate salt (Adeka Optomer SP-170, produced by Asahi Denka Kogyo K.K.), which is a photo-acid generating agent, was mixed with 100 parts by weight of the polymer (A) used in Examples 63 to 77 to obtain a composition.

The composition became an opaque but not transparent composition. UV rays in an energy dose of 1,000 to 2,500 mJ/cm$^2$ at 365 nm were irradiated by using a high pressure mercury lamp (manufactured by Toshiba Lightech Co., Ltd., TOSCURE 401), however a cured coat was hardly produced. Even if curing was carried out at 23° C. for about 7 days, no cured coat was produced.

From the results shown in Table 13 and Table 14, with respect to the photoreactive compositions obtained in Examples 63 to 77, some of the compositions were found showing stringiness quickly after several hours from the time immediately after the irradiation of light. Further, in order to investigate the stability, the compositions were left at 25° C. for 1 month under light-shielding condition, however significant viscosity increase or gel formation was not observed.

On the other hand, in the case of using a conventional moisture-curing catalyst just like Comparative Example 1, although the composition was cured, it took almost 5 days to show stringiness and even after 14 days, the gelling ratio was as low as 20% or lower.

EXAMPLE 78

To 100 parts by weight of MS polymer S-303 (produced by Kanegafuchi Chemical Industry Co., Ltd.) containing a polyoxyalkylene polymer having a functional group represented by the general formula (2-2) at the terminals of polypropyleneglycol as a compound (A), 5 parts by weight of maleic anhydride (produced by NACALAI TESQUE,

TABLE 13

| | | Example 63 | Example 64 | Example 65 | Example 66 | Example 67 | Example 68 | Example 69 | Example 70 |
|---|---|---|---|---|---|---|---|---|---|
| Compound(A) | Epion EP-103S | 100 | 100 | 100 | 100 | 100 | 100 | 100 | 100 |
| Compound(B) | Maleic anhydride | 10 | 10 | 10 | 10 | 10 | 10 | 10 | 10 |
| | Butyric anhydride | — | — | — | — | — | — | — | — |
| | Irgacure 819 | — | — | — | — | — | — | — | — |
| Compound(C) | Benzyl methyl ether | — | 10 | 10 | — | — | — | — | — |
| | Toluene | — | — | — | 10 | 10 | — | — | — |
| | Xylene | — | — | — | — | — | 10 | 10 | — |
| | Laurylmercaptan | — | — | — | — | — | — | — | 10 |
| Moisture-curing catalyst | 1,1,3,3-Tetrabutyl-1,3-dilauryloxycarbonyl distannoxane | — | — | — | — | — | — | — | — |
| Irradiation of light dose (mJ/cm$^2$, 365 nm) | | 1000 | 1000 | 2500 | 1000 | 2500 | 1000 | 2500 | 1000 |
| Stringiness exhibiting time (hr) | | 4 days | 3 days | 2 days | 3 days | 2 days | 3 days | 3 days | 6 |
| Gelling ratio (wt. %) | 1 day after irradiation of light | <1 | <1 | <1 | <1 | <1 | <1 | <1 | 24 |
| | 2 days after irradiation of light | <1 | <1 | 2 | <1 | 3 | <1 | <1 | 45 |
| | 5 days after irradiation of light | <1 | 5 | 15 | 5 | 11 | 1 | 25 | 59 |
| | 8 days after irradiation of light | 25 | 32 | 45 | 13 | 25 | 8 | 35 | 64 |
| | 14 days after irradiation of light | 43 | 58 | 65 | 25 | 55 | 30 | 58 | 67 |

TABLE 14

| | | Example 71 | Example 72 | Example 73 | Example 74 | Example 75 | Example 76 | Example 77 | Comparative Example 8 |
|---|---|---|---|---|---|---|---|---|---|
| Compound(A) | Epion EP-103S | 100 | 100 | 100 | 100 | 100 | 100 | 100 | 100 |
| Compound(B) | Maleic anhydride | 10 | — | — | — | — | — | — | — |
| | Butyric anhydride | — | 10 | 10 | — | — | — | — | — |
| | Irgacure 819 | — | — | — | 2 | 2 | 2 | 2 | — |
| Compound(C) | Benzyl methyl ether | — | — | — | 10 | 10 | — | — | — |
| | Toluene | — | — | — | — | — | — | — | — |
| | Xylene | — | — | — | — | — | — | — | — |
| | Laurylmercaptan | 10 | 10 | 10 | — | — | 10 | 10 | — |
| Moisture-curing catalyst | 1,1,3,3-Ttetrabutyl-1,3-dilauryloxycarbonyl distannoxane | — | — | — | — | — | — | — | 2 |
| Irradiation of light dose (mJ/cm$^2$, 365 nm) | | 2500 | 1000 | 2500 | 1000 | 2500 | 1000 | 2500 | — |
| Stringiness exhibiting time (hr) | | 2 | 1 | 1 | 1 day | 6 | 2 | 1 | 5 days |
| Gelling ratio (wt. %) | 1 day after irradiation of light | 39 | 67 | 68 | <1 | 12 | 49 | 64 | <1 |
| | 2 days after irradiation of light | 52 | 67 | 69 | 9 | 38 | 64 | 65 | <1 |
| | 5 days after irradiation of light | 63 | 68 | 69 | 26 | 38 | 66 | 67 | <1 |
| | 8 days after irradiation of light | 66 | 69 | 69 | 35 | 45 | 68 | 67 | 7 |
| | 14 days after irradiation of light | 68 | 70 | 70 | 40 | 52 | 69 | 67 | 14 |

INC.) and 1 part by weight of bis(2,4,6-trimethylbenzoyl)-phenylphosphine oxide (produced by Chiba Speciality Chemicals Corp., Irgacure 819) as a compound (B) were added and mixed and stirred under properly heating and light-shielding conditions until the mixture became even to obtain a photoreactive composition.

The obtained photoreactive composition was applied in a thickness of 50 μm to a polyethylene plate and UV rays in an energy dose of 1,00 mJ/cm$^2$ (16.6 mW/cm$^2$×60sec, 365 nm) were irradiated by using a high pressure mercury lamp (manufactured by Toshiba Lightech Co., Ltd., TOSCURE 401). Stringiness was observed immediately after the irradiation of light and the gelling ratio at that time was 8%. The gelling ratio was increased with the lapse of time from the irradiation of light and increased to 48% after 30 minutes and to 83% after 7 hours.

EXAMPLE 79

A photoreactive composition was produced in the same manner as Example 78, except that 1 part by weight of 2,6-di-tert-butylpyridine (produced by Aldrich Chemical Co., Inc.) as a proton collecting agent (an acid collecting agent) was added.

The obtained photoreactive composition was applied in a thickness of 50 μm to a polyethylene plate and UV rays in an energy dose of 1,000 mJ/cm$^2$ (16.6 mW/cm$^2$×60 sec, 365 nm) were irradiated by using a high pressure mercury lamp (manufactured by Toshiba Lightech Co., Ltd., TOSCURE 401). Although gel formation was not observed, stringiness was observed immediately after the irradiation of light. The gelling ratio was increased with the lapse of time from the irradiation of light and increased to 37% after 30 minutes and to 80% after 7 hours.

COMPARATIVE EXAMPLE 10

To 100 parts by weight of MS polymer S-303 (produced by Kanegafuchi Chemical Industry Co., Ltd.) containing a polyoxyalkylene polymer having a functional group represented by the general formula (2-2) at the terminals of polypropyleneglycol as a compound (A), 3 parts by weight of a commercialized aromatic onium salt catalyst (SP-170, produced by Asahi Denka Kogyo K.K.) was added and mixed to obtain a composition. The obtained composition had an opaque appearance.

The obtained composition was applied in a thickness of 50 μm to a polyethylene plate and UV rays in an energy dose of 1,000 mJ/cm$^2$ (16.6 mW/cm$^2$×60 sec, 365 nm) were irradiated by using a high pressure mercury lamp (manufactured by Toshiba Lightech Co., Ltd., TOSCURE 401). Although coat formation was observed immediately after the irradiation of light, no gel formation was observed.

COMPARATIVE EXAMPLE 11

A photoreactive composition was produced in the same manner as Comparative Example 10, except that 1 part by weight of 2,6-di-tert-butylpyridine (produced by Aldrich Chemical Co., Inc.) as a proton collecting agent (an acid collecting agent) was added.

The obtained photoreactive composition was applied in a thickness of 50 μm to a polyethylene plate and UV rays in an energy dose of 1,000 mJ/cm$^2$ (16.6 mW/cm$^2$×60 sec, 365 nm) were irradiated by using a high pressure mercury lamp (manufactured by Toshiba Lightech Co., Ltd., TOSCURE 401). No coat formation was observed immediately after the irradiation of light and the composition was observed to be a viscous liquid similar to the composition before the irradiation of light. Coat formation was finally observed after about 7 hours from the irradiation of light, however no gel formation was observed.

In comparison of Example 78 and Example 79 with each other, even if a small amount of 2,6-di-tert-butylpyridine as a proton collecting agent (an acid collecting agent) was added, no significant difference in coat and gel formation was observed.

On the other hand, in comparison of Comparative Example 10 and Comparative Example 11 with each other, attributed to addition of a small amount of 2,6-di-tert-butylpyridine as a proton collecting agent (an acid collecting agent), significant difference of time taken to form a coat was observed.

EXAMPLE 80

To 100 parts by weight of Excestar ESS-3630 (produced by Asahi Glass Co., Ltd.), polyalkyleneoxy polymer having a functional group represented by the general formula (2-2) at the terminals of polypropyleneglycol as a compound (A), 5 parts by weight of maleic anhydride (produced by NACALAI TESQUE, INC.) and 1 part by weight of Irgacure 819 (produced by Chiba Speciality Chemicals Corp.) as a compound (B) were added and mixed and stirred while being heated to about 80° C. under light-shielding condition until the mixture became even to obtain a photoreactive composition.

The obtained photoreactive composition was applied in a thickness of 350 μm to a polyethylene plate and UV rays in an energy dose of 500 mJ/cm$^2$ (8.3 mW/cm$^2$×60 sec, 365 nm) were irradiated by using a high pressure mercury lamp (manufactured by Toshiba Lightech Co., Ltd., TOSCURE 401). The fluctuation of the gelling ratio with the lapse of time is shown in Table 15.

EXAMPLE 81

The photoreactive composition produced in Example 80 was subjected to bubbling with nitrogen gas at a flow rate of 1.0 mL/min and 80° C. for 10 minutes under light-shielding condition to obtain a photoreactive composition from which dissolved oxygen was removed.

The obtained photoreactive composition was applied in a thickness of 350 μm to a polyethylene plate and UV rays in an energy dose of 500 mJ/cm$^2$ (8.3 mW/cm$^2$×60 sec, 365 nm) were irradiated by using a high pressure mercury lamp (manufactured by Toshiba Lightech Co., Ltd., TOSCURE 401) via the glass plate of 5 mm thickness. The fluctuation of the gelling ratio with the lapse of time is shown in Table 15.

EXAMPLE 82

The photoreactive composition produced in Example 81 from which dissolved oxygen was applied in a thickness of 350 μm to a polyethylene plate and a glass plate on which a polyethylene sheet was laminated was put on the formed coat in such a manner that the polyethylene sheet side was brought into contact with the coat and then UV rays in an energy dose of 500 mJ/cm$^2$ (8.3 mW/cm$^{2\times 60}$ sec, 365 nm) were irradiated via the glass plate of 5 mm thickness by using a high pressure mercury lamp (manufactured by Toshiba Lightech Co., Ltd., TOSCURE 401). Table 15 shows the fluctuation of the gelling ratio with the lapse of time from the irradiation of light in the case the curing was carried as the resulting laminate was kept as it was.

TABLE 15

|  |  | Example 80 | Example 81 | Example 82 |
|---|---|---|---|---|
| Compound(A) | ESS-3630 | 100 | 100 | 100 |
| Compound(B) | Maleic anhydride | 5 | 5 | 5 |
|  | Irgacure-819 | 1 | 1 | 1 |
|  | Post-treatment | None | Bubbling with nitrogen gas | Bubbling with nitrogen gas and cover |
| Irradiation of light dose (mJ/cm$^2$, 365 nm) |  | 500 | 500 | 500 |
| Gelling ratio (wt. %) | 2 hours after irradiation of light | 10.4 | 0.23 | 0.25 |
|  | 14 hours after irradiation of light | 78.0 | 55.4 | 0.23 |
|  | 24 hours after irradiation of light | 81.6 | 62.1 | 12.6 |

From the results shown in Table 15, in comparison of photoreactive compositions produced in Examples 80 and 81 with each other, it was understood that the photoreactive composition of Example 80 with a higher oxygen content had a higher gel formation speed. In Example 82, the dissolved oxygen in the photoreactive composition was lessened and further absorption of oxygen in air was inhibited during curing after the irradiation of light. It was found that owing to that, the gel formation speed was significantly slow down. Accordingly, it was made clear that the reaction of the photoreactive compositions was prompted in the presence of oxygen (under aerobic condition) after the irradiation of light.

EXAMPLE 83

To 100 parts by weight of Excestar ESS-3630 (produced by Asahi Glass Co., Ltd.), polyalkyleneoxy polymer having a functional group represented by the general formula (2-2) at the terminals of polypropyleneglycol as a compound (A), 5 parts by weight of maleic anhydride (produced by NACALAI TESQUE, INC.) and 1 part by weight of Irgacure 819 (produced by Chiba Speciality Chemicals Corp.) as a compound (B) were added and mixed and stirred while being heated to about 80° C. under light-shielding condition until the mixture became even to obtain a photoreactive composition.

When the obtained photoreactive composition was cooled to a room temperature, 3 parts by weight of trimethylolpropane trivinyl ether (produced by BASF Co.) as a vinyl ether was added to obtain a photoreactive composition.

The obtained photoreactive composition was applied in a thickness of 350 μm to a polyethylene plate and UV rays in an energy dose of 500 mJ/cm$^2$ (8.3 mW/cm$^2$×60 sec, 365 nm) were irradiated by using a high pressure mercury lamp (manufactured by Toshiba Lightech Co., Ltd., TOSCURE 401) via the glass plate of 5 mm thickness.

With respect to gel formation with the lapse of time after the irradiation of light, gel was produced at 40% immediately after the irradiation of light and the gelling ratio was increased to 50% after 14 hours and to 85% after 24 hours.

It was found clear that owing to the addition of a small amount of the vinyl ether, gel was formed at a high ratio even immediately after the irradiation of light as compared with that in the case of the photoreactive composition produced in Example 80.

EXAMPLE 84

To 100 parts by weight of Excestar ESS-3630 (produced by Asahi Glass Co., Ltd.), polyalkyleneoxy polymer having a functional group represented by the general formula (2-2) at the terminals of polypropyleneglycol as a compound (A), 5 parts by weight of maleic anhydride (produced by NACALAI TESQUE, INC.) and 1 part by weight of Irgacure 819 (produced by Chiba Speciality Chemicals Corp.) as a compound (B) were added and mixed and stirred while being heated to about 80° C. under light-shielding condition until the mixture became even to obtain a photoreactive composition.

When the obtained photoreactive composition was cooled to a room temperature, 1 part by weight of trimethoxysilane (produced by Shin-Etsu Chemical Co., Ltd.) as a compound producing one silanol group in one molecule by hydrolysis or a compound having one silanol group in one molecule was added to obtain a photoreactive composition.

When the obtained photoreactive composition was applied in a thickness of 350 μm to a polyethylene plate and UV rays in an energy dose of 500 mJ/cm$^2$ (8.3 mW/cm$^2$×60 sec, 365 nm) were irradiated by using a high pressure mercury lamp (manufactured by Toshiba Lightech Co., Ltd., TOSCURE 401) via the glass plate of 5 mm thickness, a crosslinked coat was obtained after 48 hours from the irradiation of light.

When the elongation of the obtained coat was evaluated, the elongation at breaking point was 450%.

EXAMPLE 85

A photoreactive composition was produced in the same manner as Example 84, except the addition amount of trimethoxysilane was changed to be 5 parts by weight and a crosslinked coat was obtained by UV irradiation.

When the elongation of the obtained coat was evaluated, the elongation at breaking point was 550%.

COMPARATIVE EXAMPLE 12

A photoreactive composition was produced in the same manner as Example 84, except that no trimethoxysilane was added and a crosslinked coat was obtained by UV irradiation.

When the elongation of the obtained coat was evaluated, the elongation at breaking point was 300%.

EXAMPLES 86 TO 88

As the compound (A), tetraethoxysilane (hereinafter, referred also to as TEOS) or a silicon oligomer having a hydrolyzable functional group (MKC silicate MS 57, hereinafter referred also to as MS 57, produced by Mitsubishi Chemical Industries Ltd.) or bis(trimetoxysilylethinyl)benzene (hereinafter, referred also to as BSEB) was used: as the compound (B), bis(2,4,6-trimethylbenzoyl)-phenylphosphine oxide (produced by Chiba Speciality Chemicals Corp., Irgacure 819, hereinafter, referred also to as Irg) was used: and as a solvent tetrahydrofuran (hereinafter, referred also to as THF) was used: and they were mixed at ratios shown in Table 16 and stirred under light-shielding condition until the compound (A) and the compound (B) in the mixed solutions became even to obtain photoreactive compositions. Any of the obtained compositions was not opaque but transparent.

Incidentally, tetraethoxysilane is a compound represented by the following formula (A-3); silicon oligomer having a hydrolyzable functional group is a compound represented by the following formula (A-4); bis(trimetoxysilylethinyl)benzene is a compound represented by the following formula (A-5); and bis(2,4,6-trimethylbenzoyl)-phenylphosphine oxide is a compound represented by the following formula (B-1).

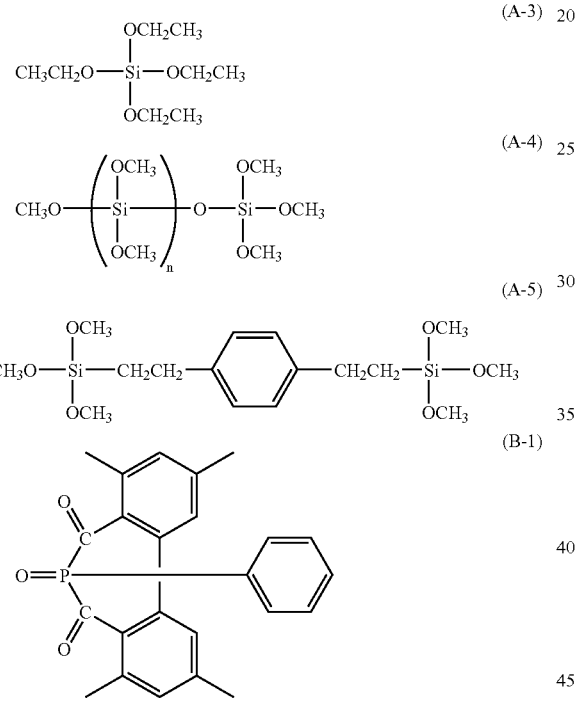

(A-3)

(A-4)

(A-5)

(B-1)

TABLE 16

| | Compound(A) | | Compound(B) | | Solvent | |
|---|---|---|---|---|---|---|
| | Type | Part by weight | Type | Part by weight | Type | Part by weight |
| Example 86 | TEOS | 100 | Irg | 5 | THF | 30 |
| Example 87 | MS57 | 100 | Irg | 5 | THF | 30 |
| Example 88 | BSEB | 100 | Irg | 5 | THF | 30 |

Each of the compositions produced in Examples 86 to 88 was applied to a silicon wafer or a glass substrate at 1,000 rpm for 10 seconds by spin coating and UV rays in 4,800 mJ/cm$^2$ dose were irirradiated for 120 seconds from a high pressure mercury lamp with a irradiation intensity of 40 mW/cm$^2$ at 365 nm (manufactured by Toshiba Lightech Co., Ltd., TOSCURE 401).

The compositions all became colorless and transparent thin films after UV irradiation.

Further, any of the obtained thin films was not dissolved in a solvent such as 2-propanol or tetrahydrofuran. Accordingly, the compositions produced in Examples 86 to 88 were confirmed to have photocurable properties.

EXAMPLES 89 TO 91

As the compound (A), tetraethoxysilane (TEOS), a silicon oligomer (MS 57) or bis(trimetoxysilylethinyl)benzene (BSEB) was used and the compound (A), 2-propanol (hereinafter, referred also to as IPA) and 0.1N hydrochloric acid were mixed at ratios shown in Table 17 and stirred.

After the obtained mixed solutions were sufficiently stirred, 3 parts by weight of benzoic anhydride (hereinafter, referred also to as BA) as the compound (B) was added to and stirred with 100 parts by weight of each of the mixed solutions to obtain photoreactive compositions. Any of the obtained photoreactive compositions was not opaque but transparent.

Incidentally, benzoic anhydride is a compound represented by the following formula (B-2).

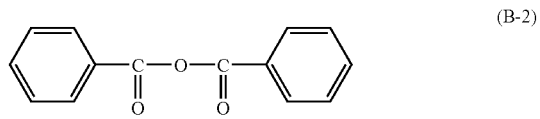

(B-2)

TABLE 17

| | Compound(A) | | Solvent | | |
|---|---|---|---|---|---|
| | Type | Part by weight | Type | Part by weight | 0.1 N hydrochloric acid (parts by weight) |
| Example 89 | TEOS | 40 | IPA | 145 | 15 |
| Example 90 | MS57 | 40 | IPA | 145 | 15 |
| Example 91 | BSEB | 37.5 | IPA | 150 | 10.8 |

Each of the compositions-produced in Examples 89 to 91 was applied to a silicon wafer or a glass substrate by spin coating and UV rays emitted from a high pressure mercury lamp were irradiated to each photoreactive composition while a portion of the UV rays were masked by a mask.

After that, when the coat face coated with the photoreactive composition was washed for 1 to 2 minutes with 2-propanol, the thin film was found remaining by the observation of the part where UV rays were irradiated, but in the part which was masked and therefore where no UV was irradiated, no film was found remaining due to dissolution in 2-propanol.

From such results, the photoreactive compositions obtained in Examples 89 to 91 were found usable as pattern formation materials.

COMPARATIVE EXAMPLES 13 TO 18

Compositions were produced in the same manner as Examples 86 to 91, except that no compound (B) was added. Each of the obtained compositions was applied to a silicon wafer or a glass substrate by spin coating and UV rays emitted from a high pressure mercury lamp were irradiated, however any was cured and found dissolved in 2-propanol or tetrahydrofuran.

Accordingly, the compositions produced in Comparative Examples 13 to 18 were found having no photoreactivity and not cured even if light was irradiated.

COMPARATIVE EXAMPLE 19

The composition obtained in Example 86 was applied to a silicon wafer or a glass substrate by spin coating. Then, without UV irradiation, the coat face coated with the composition was washed for 1 to 2 minutes with 2-propanol to find that the composition was dissolved and no remaining was observed.

COMPARATIVE EXAMPLES 20 TO 25

Compositions were produced in the same manner as Examples 86 to 91, except that acetylacetone was used in place of the compounds as the compound (B) in the Examples 86 to 91. Each of the obtained compositions was applied to a silicon wafer or a glass substrate by spin coating and UV rays emitted from a high pressure mercury lamp were irradiated, however any was cured and found dissolved in 2-propanol or tetrahydrofuran.

Accordingly, the compositions produced in Comparative Examples 20 to 25 were found having no photoreactivity and not cured even if light was irradiated.

Incidentally, in the case of using TEOS as the compound (A), the composition was evaporated from the coat face even if light was irradiated to the composition.

EXAMPLES 92 TO 98

The compound (A), the compound (B), and solvents at mixing ratios shown in Table 18 were added and mixed and stirred under light-shielding condition to obtain compositions. Incidentally, "Irgacure 819" shown in Table 18 is a trade name produced by Chiba Speciality Chemicals Corp. and bis(2,4,6-trimethylbenzoyl)-phenylphosphine oxide.

Any of the obtained compositions was not opaque but transparent.

Each of the compositions produced in Examples 92 to 98 was applied to a silicon wafer or a glass substrate by spin coating and UV rays emitted to find that all of the compositions form thin films after the UV irradiation and the thin films were not dissolved at all in solvent such as 2-propanol and tetrahydrofuran. From such results, the compositions produced in Examples 92 to 98 were confirmed to have photocuring properties.

Further, after the composition produced in Example 95 was applied to a silicon wafer or a glass substrate by spin coating, UV rays-emitted from a high pressure mercury lamp were irradiated while a portion of the UV rays were masked by a mask with a line width of 30 μm and line intervals of 40 μm and when the exposed face was developed by 2-propanol, the non-irradiation parts were removed to form patterns.

COMPARATIVE EXAMPLES 26, 27

The compound (A), acetylacetone, and solvents at mixing ratios shown in Table 18 were mixed and stirred under light-shielding condition to obtain solutions. The obtained solutions were applied to a silicon wafer or a glass substrate and UV rays were irirradiated, however the compositions were not cured.

TABLE 18

| | Compound(A) | | Compound(B) | | Others | | Solvent | |
|---|---|---|---|---|---|---|---|---|
| | Type | Part by weight | Type | Part by weight | Type | Part by weight | Type | Part by weight |
| Example 92 | Trimethyl borate | 100 | Benzoic anhydride | 10 | — | — | 2-Propanol | 150 |
| Example 93 | Aluminum tris(acetylacetonate) | 100 | Irgacure 819 | 5 | — | — | Toluene | 250 |
| Example 94 | Titanium tetraIsopropoxide | 100 | Benzoic anhydride | 10 | — | — | 2-Propanol | 400 |
| Example 95 | Zirconium n-butoxide | 100 | Benzoic anhydride | 10 | — | — | 2-Propanol | 400 |
| Example 96 | Thallium n-pentoxide | 100 | N-Phenylmaleimide | 10 | — | — | Tetrahydrofuran | 400 |
| Example 97 | Zinc acetate | 100 | Benzoic anhydride | 10 | — | — | Methanol | 400 |
| Example 98 | Indium nitrate tin(IV) chloride | 90 10 | Benzoic anhydride | 10 | — | — | Methanol | 100 |
| Comparative Example 26 | Trimethyl borate | 100 | — | | Acetylacetone | 20 | 2-Propanol | 300 |
| Comparative Example 27 | Zinc acetate | 100 | — | | Acetylacetone | 20 | 2-Propanol | 300 |

EXAMPLE 99

Bis(trimethoxysilylethinyl)benzene as the compound (A) 100 parts by weight, N-methylmaleimide represented by the following formula (B-3) as the compound (B) 25 parts by weight, and tetrahydrofuran as an organic solvent 1.25 parts by weight were mixed and stirred evenly under light-shielding condition to obtain a composition. The obtained composition was not opaque but transparent.

When the obtained composition was applied to a silicon wafer or a glass substrate at 1,000 rpm for 10 seconds by spin coating and UV rays in 4,800 mJ/cm$^2$ dose were irradiated for 120 seconds from a high pressure mercury lamp with a irradiation intensity of 4 mW/cm$^2$ at 365 nm (manufactured by Toshiba Lightech Co., Ltd., TOSCURE 401), the composition became a colorless and transparent thin film. After the obtained thin film was heated at 200° C. for 1 hour, it was immersed in 2-propanol for 1 to 2 minutes but it was not dissolved. Accordingly, the composition was confirmed to have photocurable properties.

Further, the obtained composition was applied to a silicon wafer or a glass substrate by spin coating and UV rays in 4,800 mJ/cm$^2$ dose were irradiated to the composition while a portion of the UV rays were masked. After heating treatment at 200° C. for 1 hour was carried out, the coat face coated with the composition was washed with 2-propanol for 1 to 2 minutes to find that the film remained in the portion to which UV rays were irradiated but that the portion which was masked and therefore to which no UV was irradiated was dissolved in 2-propanol and did not remain. From such results, the obtained composition was found usable as a pattern formation material.

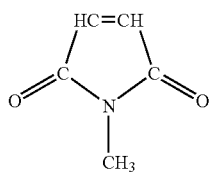
(B-3)

INDUSTRIAL APPLICABILITY

According to the present invention, a photoreactive composition of which a hydrolyzable metal compound is reacted by irradiation of light can be obtained.

The invention claimed is:

1. A conductive material composition which comprises a hydrolyzable metal compound (A) comprising a metal atom and a hydrolyzable functional group bonded to the metal atom and,
   a compound (b) promoting reaction, polymerization or crosslinking of the compound (A) in the presence of oxygen by irradiation of light and which does not contain a photo acid generator,
   wherein the compound (B) has a molecular skeleton represented by the following general formula (1);

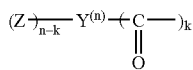
(1)

in the formula, n is an integer of 2, 3, 4 or 5; k is an integer equal to or lower than n; Y is an atom belonging to group IVB, VB or VIB in the periodic table; and Z is hydrogen or hydroxyl, mercapto, amino, a halogen, an alkoxyl, an alkylthio, carbonyloxy or oxo group and may be the same as or different from one another; however, when Y is carbon, at least one of Z is a group having an aromatic ring or an unsaturated bond.

2. A conductive material composition
   which comprises a hydrolyzable metal compound (A) comprising a metal atom and a hydrolyzable functional group bonded to the metal atom and,
   a compound (b) promoting reaction, polymerization or crosslinking of the compound (A) in the presence of oxygen by irradiation of light and which does not contain a photo acid generator,
   wherein the hydrolyzable metal compound (A) is a compound (A1) represented by the following general formula (2-1):

$(X)_mSi(R)_{4-m}$ (21)

in the formula, m is an integer of 2, 3, or 4, R is a hydrocarbon group; and X is a hydrolyzable functional group.

3. A transparent conductive material composition
   which comprises a hydrolyzable metal compound (a) comprising a metal atom and a hydrolyzable functional group bonded to the metal atom and,
   a compound (b) promoting reaction, polymerization or crosslinking of the compound (a) in the presence of oxygen by irradiation of light and which does not contain a photo acid generator,
   wherein the compound (B) has a molecular skeleton represented by the following general formula (1);

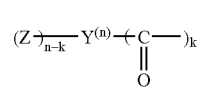
(1)

in the formula, n is an integer of 2, 3, 4 or 5; k is an integer equal to or lower than n; Y is an atom belonging to group IVB, VB or VIB in the periodic table; and Z is hydrogen or hydroxyl, mercapto, amino, a halogen, an alkoxyl, an alkylthio, carbonyloxy or oxo group and may be the same as or different from one another; however, when Y is carbon, at least one of Z is a group having an aromatic ring or an unsaturated bond.

4. A transparent conductive material composition
   which comprises a hydrolyzable metal compound (a) comprising a metal atom and a hydrolyzable functional group bonded to the metal atom and,
   a compound (b) promoting reaction, polymerization or crosslinking of the compound (a) in the presence of oxygen by irradiation of light and which does not contain a photo acid generator,
   wherein the hydrolyzable metal compound (A) is a compound (A1) represented by the following general formula (2-1):

$(X)_mSi(R)_{4-m}$ (2-1)

in the formula, m is an integer of 2, 3, or 4, R is a hydrocarbon group; and X is a hydrolyzable functional group.

5. A color filter composition which comprises a hydrolyzable metal compound (A) comprising a metal atom and a hydrolyzable functional group bonded to the metal atom and,
   a compound (B) promoting reaction, polymerization or crosslinking of the compound (A) in the presence of oxygen by irradiation of light and which does not contain a photo acid generator,
   wherein the a compound (B) has a molecular skeleton represented by the following general formula (1);

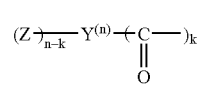
(1)

in the formula, n is an integer of 2, 3, 4 or 5; k is an integer equal to or lower than n; Y is an atom belonging to group IVB, VB or VIB in the periodic table; and Z is hydrogen or hydroxyl, mercapto, amino, a halogen, an alkoxyl, an alkylthio, carbonyloxy or oxo group and may be the same as or different from one another; however, when Y is carbon, at least one of Z is a group having an aromatic ring or an unsaturated bond.

6. A color filter composition which comprises a hydrolyzable metal compound (A) comprising a metal atom and a hydrolyzable functional group bonded to the metal atom and, a compound (B) promoting reaction, polymerization or crosslinking of the compound (A) in the presence of oxygen by irradiation of light and which does not contain a photo acid generator, wherein the hydrolyzable metal compound (A) is a compound (A1) represented by the following general formula (2-1):

$$(X)_m Si(R)_{4-m} \qquad (2\text{-}1)$$

in the formula, m is an integer of 2, 3, or 4, R is a hydrocarbon group; and X is a hydrolyzable functional group.

* * * * *